United States Patent
D'Evelyn et al.

(10) Patent No.: US 9,564,320 B2
(45) Date of Patent: Feb. 7, 2017

(54) LARGE AREA NITRIDE CRYSTAL AND METHOD FOR MAKING IT

(71) Applicant: SORAA, INC., Fremont, CA (US)

(72) Inventors: Mark P. D'Evelyn, Fremont, CA (US); James S. Speck, Fremont, CA (US); Derrick S. Kamber, Fremont, CA (US); Douglas W. Pocius, Fremont, CA (US)

(73) Assignee: Soraa, Inc., Fremont, CA (US)

( * ) Notice: Subject to any disclaimer, the term of this patent is extended or adjusted under 35 U.S.C. 154(b) by 859 days.

(21) Appl. No.: 13/731,453

(22) Filed: Dec. 31, 2012

(65) Prior Publication Data

US 2013/0119401 A1    May 16, 2013

Related U.S. Application Data

(63) Continuation-in-part of application No. 13/160,307, filed on Jun. 14, 2011, now abandoned.

(60) Provisional application No. 61/356,489, filed on Jun. 18, 2010, provisional application No. 61/386,879, filed on Sep. 27, 2010.

(51) Int. Cl.
| | |
|---|---|
| *H01L 21/02* | (2006.01) |
| *H01L 29/20* | (2006.01) |
| *C30B 25/02* | (2006.01) |
| *C30B 25/18* | (2006.01) |

(Continued)

(52) U.S. Cl.
CPC ......... *H01L 21/02609* (2013.01); *C30B 25/02* (2013.01); *C30B 25/18* (2013.01); *C30B 29/403* (2013.01); *C30B 33/06* (2013.01); *H01L 29/2003* (2013.01)

(58) Field of Classification Search
CPC .......... H01L 21/02609; H01L 29/2003; C30B 33/06; C30B 25/18; C30B 29/403; C30B 25/02

See application file for complete search history.

(56) References Cited

U.S. PATENT DOCUMENTS

| | | |
|---|---|---|
| 3,245,760 A | 4/1966 | Sawyer |
| 3,303,053 A | 2/1967 | Strong et al. |

(Continued)

FOREIGN PATENT DOCUMENTS

| | | |
|---|---|---|
| CN | 101061570 | 10/2007 |
| JP | H06-87691 | 3/1994 |

(Continued)

OTHER PUBLICATIONS

Altoukhov et al., 'High reflectivity airgap distributed Bragg reflectors realized by wet etching of AlInN sacrificial layers', Applied Physics Letters, vol. 95, 2009, pp. 191102-1-191102-3.

(Continued)

*Primary Examiner* — Jonathan Langman
(74) *Attorney, Agent, or Firm* — Saul Ewing LLP

(57) ABSTRACT

Techniques for processing materials in supercritical fluids including processing in a capsule disposed within a high-pressure apparatus enclosure are disclosed. The disclosed techniques are useful for growing crystals of GaN, AlN, InN, and their alloys, including InGaN, AlGaN, and AlInGaN for the manufacture of bulk or patterned substrates, which in turn can be used to make optoelectronic devices, lasers, light emitting diodes, solar cells, photoelectrochemical water splitting and hydrogen generation devices, photodetectors, integrated circuits, and transistors.

22 Claims, 22 Drawing Sheets

(51) Int. Cl.
*C30B 29/40* (2006.01)
*C30B 33/06* (2006.01)

(56) References Cited

U.S. PATENT DOCUMENTS

| | | |
|---|---|---|
| 3,335,084 A | 8/1967 | Hall |
| 4,030,966 A | 6/1977 | Hornig et al. |
| 4,066,868 A | 1/1978 | Witkin et al. |
| 4,350,560 A | 9/1982 | Helgeland et al. |
| 4,430,051 A | 2/1984 | von Platen |
| 5,098,673 A | 3/1992 | Engel et al. |
| 5,127,983 A | 7/1992 | Imai et al. |
| 5,169,486 A | 12/1992 | Young et al. |
| 5,474,021 A | 12/1995 | Tsuno et al. |
| 5,868,837 A | 2/1999 | DiSalvo et al. |
| 6,090,202 A | 7/2000 | Klipov |
| 6,129,900 A | 10/2000 | Satoh et al. |
| 6,152,977 A | 11/2000 | D'Evelyn |
| 6,273,948 B1 | 8/2001 | Porowski et al. |
| 6,350,191 B1 | 2/2002 | D'Evelyn |
| 6,372,002 B1 | 4/2002 | D'Evelyn et al. |
| 6,398,867 B1 | 6/2002 | D'Evelyn et al. |
| 6,406,540 B1 | 6/2002 | Harris et al. |
| 6,406,776 B1 | 6/2002 | D'Evelyn |
| 6,455,877 B1 | 9/2002 | Ogawa et al. |
| 6,475,254 B1 | 11/2002 | Saak et al. |
| 6,528,427 B2 | 3/2003 | Chebi et al. |
| 6,533,874 B1 | 3/2003 | Vaudo et al. |
| 6,541,115 B2 | 4/2003 | Pender et al. |
| 6,596,040 B2 | 7/2003 | Kim et al. |
| 6,596,079 B1 | 7/2003 | Vaudo et al. |
| 6,639,925 B2 | 10/2003 | Niwa et al. |
| 6,656,615 B2 | 12/2003 | Dwilinski et al. |
| 6,686,608 B1 | 2/2004 | Takahira |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,805,745 B2 | 10/2004 | Snyder |
| 6,806,508 B2 | 10/2004 | D'Evelyn et al. |
| 6,858,882 B2 | 2/2005 | Tsuda et al. |
| 6,861,130 B2 | 3/2005 | D'Evelyn et al. |
| 6,887,144 B2 | 5/2005 | D'Evelyn et al. |
| 6,936,488 B2 | 8/2005 | D'Evelyn et al. |
| 6,955,719 B2 | 10/2005 | Dmitriev et al. |
| 7,001,577 B2 | 2/2006 | Zimmerman et al. |
| 7,009,199 B2 | 3/2006 | Hall |
| 7,009,215 B2 | 3/2006 | D'Evelyn et al. |
| 7,012,279 B2 | 3/2006 | Wierer Jr. et al. |
| 7,026,755 B2 | 4/2006 | Setlur et al. |
| 7,026,756 B2 | 4/2006 | Shimizu et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,067,407 B2 | 6/2006 | Kostamo et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,102,158 B2 | 9/2006 | Tysoe et al. |
| 7,105,865 B2 | 9/2006 | Nakahata et al. |
| 7,112,829 B2 | 9/2006 | Picard et al. |
| 7,119,372 B2 | 10/2006 | Stokes et al. |
| 7,122,827 B2 | 10/2006 | Alizadeh et al. |
| 7,125,453 B2 | 10/2006 | D'Evelyn et al. |
| 7,160,388 B2 | 1/2007 | Dwili ski et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,208,393 B2 | 4/2007 | Haskell et al. |
| 7,211,833 B2 | 5/2007 | Slater, Jr. et al. |
| 7,220,658 B2 | 5/2007 | Haskell et al. |
| 7,252,712 B2 | 8/2007 | Dwilinski et al. |
| 7,279,040 B1 | 10/2007 | Wang |
| 7,285,801 B2 | 10/2007 | Eliashevich et al. |
| 7,291,544 B2 | 11/2007 | D'Evelyn et al. |
| 7,316,746 B2 | 1/2008 | D'Evelyn et al. |
| 7,329,371 B2 | 2/2008 | Setlur et al. |
| 7,335,262 B2 | 2/2008 | Dwilinski et al. |
| 7,338,828 B2 | 3/2008 | Imer et al. |
| 7,358,542 B2 | 4/2008 | Radkov et al. |
| 7,364,619 B2 | 4/2008 | Dwilinski et al. |
| 7,368,015 B2 | 5/2008 | D'Evelyn et al. |
| 7,381,391 B2 | 6/2008 | Spencer et al. |
| 7,381,591 B2 | 6/2008 | Moden |
| 7,420,261 B2 | 9/2008 | Dwili ski et al. |
| 7,569,206 B2 | 8/2009 | Spencer et al. |
| 7,572,425 B2 | 8/2009 | McNulty et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,871,839 B2 | 1/2011 | Lee et al. |
| 7,976,630 B2 | 7/2011 | Poblenz et al. |
| 8,021,481 B2 | 9/2011 | D'Evelyn |
| 8,048,225 B2 | 11/2011 | Poblenz et al. |
| 8,097,081 B2 | 1/2012 | D'Evelyn |
| 8,148,801 B2 | 4/2012 | D'Evelyn |
| 8,188,504 B2 | 5/2012 | Lee |
| 8,198,643 B2 | 6/2012 | Lee et al. |
| 8,207,548 B2 | 6/2012 | Nagai |
| 8,278,656 B2 | 10/2012 | Mattmann et al. |
| 8,284,810 B1 | 10/2012 | Sharma et al. |
| 8,299,473 B1 | 10/2012 | D'Evelyn et al. |
| 8,303,710 B2 | 11/2012 | D'Evelyn |
| 8,306,081 B1 | 11/2012 | Schmidt et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 8,729,559 B2 | 5/2014 | Krames et al. |
| 8,871,024 B2 | 10/2014 | D'Evelyn |
| 8,878,230 B2 | 11/2014 | D'Evelyn |
| 2001/0009134 A1 | 7/2001 | Kim et al. |
| 2001/0011935 A1 | 8/2001 | Lee et al. |
| 2001/0048114 A1 | 12/2001 | Morita et al. |
| 2002/0070416 A1 | 6/2002 | Morse et al. |
| 2002/0105986 A1 | 8/2002 | Yamasaki |
| 2002/0182768 A1 | 12/2002 | Morse et al. |
| 2002/0189532 A1 | 12/2002 | Motoki et al. |
| 2003/0027014 A1 | 2/2003 | Johnson et al. |
| 2003/0140845 A1 | 7/2003 | D'Evelyn et al. |
| 2003/0145784 A1 | 8/2003 | Thompson et al. |
| 2003/0164507 A1 | 9/2003 | Edmond et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0023427 A1 | 2/2004 | Chua et al. |
| 2004/0104391 A1 | 6/2004 | Maeda et al. |
| 2004/0124435 A1 | 7/2004 | D'Evelyn et al. |
| 2004/0161222 A1 | 8/2004 | Niida et al. |
| 2004/0222357 A1 | 11/2004 | King et al. |
| 2004/0245535 A1 | 12/2004 | D'Evelyn et al. |
| 2005/0087753 A1 | 4/2005 | D'Evelyn et al. |
| 2005/0093003 A1* | 5/2005 | Shibata .................. 257/79 |
| 2005/0098095 A1 | 5/2005 | D'Evelyn et al. |
| 2005/0109240 A1 | 5/2005 | Maeta et al. |
| 2005/0121679 A1 | 6/2005 | Nagahama et al. |
| 2005/0128459 A1 | 6/2005 | Zwet et al. |
| 2005/0128469 A1 | 6/2005 | Hall et al. |
| 2005/0152820 A1 | 7/2005 | D'Evelyn et al. |
| 2005/0167680 A1 | 8/2005 | Shei et al. |
| 2005/0191773 A1 | 9/2005 | Suzuki et al. |
| 2005/0205215 A1 | 9/2005 | Giddings et al. |
| 2005/0263791 A1 | 12/2005 | Yanagihara et al. |
| 2006/0021582 A1 | 2/2006 | Saito et al. |

(56) References Cited

U.S. PATENT DOCUMENTS

| | | |
|---|---|---|
| 2006/0030738 A1 | 2/2006 | Vanmaele et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0038193 A1 | 2/2006 | Wu et al. |
| 2006/0048699 A1 | 3/2006 | D'Evelyn et al. |
| 2006/0096521 A1 | 5/2006 | D'Evelyn et al. |
| 2006/0118799 A1 | 6/2006 | D'Evelyn et al. |
| 2006/0124051 A1 | 6/2006 | Yoshioka et al. |
| 2006/0163589 A1 | 7/2006 | Fan et al. |
| 2006/0169993 A1 | 8/2006 | Fan et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0214287 A1 | 9/2006 | Ogihara et al. |
| 2006/0228870 A1 | 10/2006 | Oshima |
| 2006/0246687 A1 | 11/2006 | Kaiser et al. |
| 2006/0255341 A1 | 11/2006 | Pinnington et al. |
| 2006/0255343 A1 | 11/2006 | Ogihara et al. |
| 2006/0288927 A1 | 12/2006 | Chodelka et al. |
| 2006/0289386 A1 | 12/2006 | Tysoe et al. |
| 2007/0015345 A1 | 1/2007 | Baker et al. |
| 2007/0057337 A1 | 3/2007 | Kano et al. |
| 2007/0077674 A1 | 4/2007 | Okuyama et al. |
| 2007/0096239 A1 | 5/2007 | Cao et al. |
| 2007/0105351 A1 | 5/2007 | Motoki et al. |
| 2007/0114569 A1 | 5/2007 | Wu et al. |
| 2007/0121690 A1 | 5/2007 | Fujii et al. |
| 2007/0131967 A1 | 6/2007 | Kawaguchi et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0164292 A1 | 7/2007 | Okuyama |
| 2007/0166853 A1 | 7/2007 | Guenther et al. |
| 2007/0178039 A1 | 8/2007 | D'Evelyn et al. |
| 2007/0181056 A1 | 8/2007 | D'Evelyn et al. |
| 2007/0190758 A1 | 8/2007 | Kaeding et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0228404 A1 | 10/2007 | Tran et al. |
| 2007/0234946 A1 | 10/2007 | Hashimoto et al. |
| 2007/0252164 A1 | 11/2007 | Zhong et al. |
| 2007/0274359 A1 | 11/2007 | Takeuchi et al. |
| 2007/0290224 A1 | 12/2007 | Ogawa |
| 2008/0006831 A1 | 1/2008 | Ng |
| 2008/0008855 A1 | 1/2008 | D'Evelyn et al. |
| 2008/0023691 A1 | 1/2008 | Jang et al. |
| 2008/0025360 A1 | 1/2008 | Eichler et al. |
| 2008/0056984 A1 | 3/2008 | Yoshioka et al. |
| 2008/0073660 A1 | 3/2008 | Ohno et al. |
| 2008/0083741 A1 | 4/2008 | Giddings et al. |
| 2008/0083929 A1 | 4/2008 | Fan et al. |
| 2008/0083970 A1 | 4/2008 | Kamber et al. |
| 2008/0087919 A1 | 4/2008 | Tysoe et al. |
| 2008/0106212 A1 | 5/2008 | Yen et al. |
| 2008/0121906 A1 | 5/2008 | Yakushiji |
| 2008/0128752 A1 | 6/2008 | Wu |
| 2008/0156254 A1 | 7/2008 | Dwilinski et al. |
| 2008/0193363 A1 | 8/2008 | Tsuji |
| 2008/0198881 A1 | 8/2008 | Farrell et al. |
| 2008/0211416 A1 | 9/2008 | Negley et al. |
| 2008/0230765 A1 | 9/2008 | Yoon et al. |
| 2008/0272462 A1 | 11/2008 | Shimamoto et al. |
| 2008/0282978 A1 | 11/2008 | Butcher et al. |
| 2008/0285609 A1 | 11/2008 | Ohta et al. |
| 2008/0298409 A1 | 12/2008 | Yamashita et al. |
| 2009/0078955 A1 | 3/2009 | Fan et al. |
| 2009/0092536 A1 | 4/2009 | Kawabata et al. |
| 2009/0146170 A1 | 6/2009 | Zhong et al. |
| 2009/0213593 A1 | 8/2009 | Foley et al. |
| 2009/0218593 A1 | 9/2009 | Kamikawa et al. |
| 2009/0236694 A1 | 9/2009 | Mizuhara et al. |
| 2009/0250686 A1 | 10/2009 | Sato et al. |
| 2009/0298265 A1 | 12/2009 | Fujiwara |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D'Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0032691 A1 | 2/2010 | Kim |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109030 A1 | 5/2010 | Krames et al. |
| 2010/0109126 A1 | 5/2010 | Arena |
| 2010/0117101 A1 | 5/2010 | Kim et al. |
| 2010/0117118 A1 | 5/2010 | Dabiran et al. |
| 2010/0147210 A1 | 6/2010 | D'Evelyn |
| 2010/0151194 A1 | 6/2010 | D'Evelyn |
| 2010/0189981 A1 | 7/2010 | Poblenz et al. |
| 2010/0219505 A1 | 9/2010 | D'Evelyn |
| 2010/0295088 A1 | 11/2010 | D'Evelyn et al. |
| 2011/0017298 A1 | 1/2011 | Lee |
| 2011/0062415 A1 | 3/2011 | Ohta et al. |
| 2011/0064103 A1 | 3/2011 | Ohta et al. |
| 2011/0100291 A1 | 5/2011 | D'Evelyn |
| 2011/0108081 A1 | 5/2011 | Werthen et al. |
| 2011/0121331 A1 | 5/2011 | Simonian et al. |
| 2011/0175200 A1 | 7/2011 | Yoshida |
| 2011/0183498 A1 | 7/2011 | D'Evelyn |
| 2011/0203514 A1 | 8/2011 | Pimputkar et al. |
| 2011/0220912 A1 | 9/2011 | D'Evelyn |
| 2011/0256693 A1 | 10/2011 | D'Evelyn et al. |
| 2011/0262773 A1 | 10/2011 | Poblenz et al. |
| 2012/0000415 A1 | 1/2012 | D'Evelyn et al. |
| 2012/0007102 A1 | 1/2012 | Feezell et al. |
| 2012/0025231 A1 | 2/2012 | Krames et al. |
| 2012/0073494 A1 | 3/2012 | D'Evelyn |
| 2012/0091465 A1 | 4/2012 | Krames et al. |
| 2012/0112320 A1 | 5/2012 | Kubo et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0178215 A1 | 7/2012 | D'Evelyn |
| 2012/0187412 A1 | 7/2012 | D'Evelyn et al. |
| 2012/0199952 A1 | 8/2012 | D'Evelyn et al. |
| 2013/0251615 A1 | 9/2013 | D'Evelyn et al. |
| 2013/0323490 A1 | 12/2013 | D'Evelyn et al. |
| 2014/0065360 A1 | 3/2014 | D'Evelyn et al. |

FOREIGN PATENT DOCUMENTS

| | | |
|---|---|---|
| JP | 10-032348 | 2/1998 |
| JP | 2002-513375 | 5/2002 |
| JP | 2005-289797 | 10/2005 |
| JP | 2005-298269 | 10/2005 |
| JP | 2006-315947 | 11/2006 |
| JP | 2007-039321 | 2/2007 |
| JP | 2008-133151 | 6/2008 |
| JP | 2008-521737 | 6/2008 |
| JP | 2008-222519 | 9/2008 |
| JP | 2009-071287 | 4/2009 |
| JP | 2009-520678 | 5/2009 |
| JP | 2009-527913 | 7/2009 |
| JP | 2009-286652 | 12/2009 |
| JP | 2010-010705 | 1/2010 |
| JP | 2010-047463 | 3/2010 |
| JP | 2012-512119 | 5/2012 |
| WO | WO 2004/030061 | 4/2004 |
| WO | WO 2004/061923 | 7/2004 |

(56) References Cited

FOREIGN PATENT DOCUMENTS

| WO | WO 2005/121415 | 12/2005 |
|---|---|---|
| WO | WO 2006/057463 | 1/2006 |
| WO | WO 2006/038467 | 4/2006 |
| WO | WO 2007/004495 | 1/2007 |
| WO | WO 2010/068916 | 6/2010 |
| WO | WO 2012/016033 | 2/2012 |

OTHER PUBLICATIONS

Copel et al., 'Surfactants in Epitaxial Growth', Physical Review Letters, Aug. 7, 1989, vol. 63, No. 6, p. 632-635.

Dorsaz et al., 'Selective oxidation of AlInN Layers for current confinement III-nitride devices', Applied Physics Letters, vol. 87, 2005, pp. 072102.

Grzegory, 'High pressure growth of bulk GaN from Solutions in gallium', Journal of Physics Condensed Matter, vol. 13, 2001, pp. 6875-6892.

Lu et al., 'Structure of the CI-passivated GaAs(111) surface', Physical Review B, Nov. 15, 1998, vol. 58, No. 20, pp. 13820-13823.

Massies et al., 'Surfactant mediated epitaxial growth of InxGa1—xAs on GaAs (001)', Applied Physics Letters, vol. 61, No. 1, Jul. 6, 1992, pp. 99-101.

Moutanabbir, 'Bulk GaN Ion Cleaving', Journal of Electronic Materials, vol. 39, 2010, pp. 482-488.

Porowski, 'Near Defect Free GaN Substrates', Journal of Nitride Semiconductor, 1999, pp. 1-11.

Sharma et al., 'Vertically oriented GaN-based air-gap distributed Bragg reflector structure fabricated using band-gap-selective photoelectrochemical etching', Applied Physics Letters, vol. 87, 2005, pp. 051107.

Sumiya et al., 'High-pressure synthesis of high-purity diamond crystal', Diamond and Related Materials, 1996, vol. 5, pp. 1359-1365.

Communication from the Chinese Patent Office re 200980134876.2 dated Jul. 3, 2013, 14 pages.

Communication from the Polish Patent Office re P394857 dated Aug. 14, 2013, 2 pages.

USPTO Office Action for U.S. Appl. No. 12/133,365 dated Aug. 21, 2013, 29 pages.

USPTO Office Action for U.S. Appl. No. 12/334,418 dated Sep. 17, 2013, 27 pages.

USPTO Office Action for U.S. Appl. No. 12/497,969 dated Sep. 6, 2013, 21 pages.

USPTO Office Action for U.S. Appl. No. 12/636,683 dated Aug. 16, 2013, 16 pages.

USPTO Office Action for U.S. Appl. No. 12/697,171 dated Jun. 20, 2013, 17 pages.

USPTO Office Action for U.S. Appl. No. 12/697,171 dated Aug. 20, 2013, 17 pages.

USPTO Office Action for U.S. Appl. No. 13/272,981 dated Aug. 15, 2013, 13 pages.

USPTO Office Action for U.S. Appl. No. 13/472,356 dated Dec. 9, 2013 (11 pages).

Amano et al., 'Metalorganic Vapor Phase Epitaxial Growth of a High Quality GaN Film Using an AlN Buffer Layer', Applied Physics Letter, vol. 48, No. 5, 1986, pp. 353-355.

Baker et al., 'Characterization of Planar Semipolar Gallium Nitride Films on Spinel Substrates', Japanese Journal of Applied Physics, vol. 44, No. 29, 2005, pp. L920-L922.

Baker et al., 'Characterization of Planar Semipolar Gallium Nitride Films on Sapphire Substrates', Japanese Journal of Applied Physics, vol. 45, No. 6, 2006, pp. L154-L157.

Cantu et al., 'Si Doping Effect on Strain Reduction in Compressively Strained Al0.49Ga0.51N Thin Films', Applied Physics Letter, vol. 83, No. 4, 2003, pp. 674-676.

Chakraborty et al., 'Defect Reduction in Nonpolar a-Plane GaN Films Using in situ SiNx Nanomask', Applied Physics Letters, vol. 89, 2006, pp. 041903-1-041903-3.

Corrion et al., 'Structural and Morphological Properties of GaN Buffer Layers Grown by Ammonia Molecular Beam Epitaxy on SiC Substrates for AlGaN/GaN High Electron Mobility Transistors', Journal of Applied Physics, vol. 103, No. 9, 2008, pp. 093529-1-093529-7.

Davidsson et al., 'Effect of AlN Nucleation Layer on the Structural Properties of Bulk GaN Grown on Sapphire by Molecular-Beam Epitaxy', Journal of Applied Physics, vol. 98, No. 1, 2005, pp. 016109-1-016109-3.

Grandjean et al., 'Nitridation of Sapphire. Effect on the Optical Properties of GaN Epitaxial Overlayers', Applied Physics Letters, vol. 69, No. 14, 1996, pp. 2071-2073.

Green et al., 'Polarity Control During Molecular Beam Epitaxy Growth of Mg-Doped GaN', Journal of Vacuum Science Technology, vol. B-21, No. 4, 2003, pp. 1804-1811.

Hellman, 'The Polarity of GaN: A Critical Review', MRS Internet Journal Nitride Semiconductor Research, vol. 3, No. 11, 1998, pp. 1-11.

Heying et al., 'Control of GaN Surface Morphologies Using Plasma-Assisted Molecular Beam Epitaxy', Journal of Applied Physics, vol. 88, No. 4, 2000, pp. 1855-1860.

Katona et al., 'Observation of Crystallographic Wing Tilt in Cantilever Epitaxy of GaN on Silicon Carbide and Silicon (111) Substrates', Applied Physics Letters, vol. 79, No. 18, 2001, pp. 2907-2909.

Keller et al., 'Influence of Sapphire Nitridation on Properties of Gallium Nitride Grown by Metalorganic Chemical Vapor Deposition', Applied Physics Letters, vol. 68, No. 11, 1996, pp. 1525-1527.

Keller et al., 'Influence of the Substrate Misorientation on the Properties of N-Polar GaN Films Grown by Metal Organic Chemical Vapor Deposition', Journal of Applied Physics, vol. 102, 2007, pp. 083546-1-083546-6.

Koblmuller et al., 'In Situ Investigation of Growth Modes During Plasma-Assisted Molecular Beam Epitaxy of (0001) GaN', Applied Physics Letters, vol. 91, 2007, pp. 161904-1-161904-3.

Koblmuller et al., 'High Electron Mobility GaN Grown Under N-Rich Conditions by Plasma-Assisted Molecular Beam Epitaxy', Applied Physics Letters, vol. 91, 2007, pp. 221905-1-221905-3.

Manfra et al., 'Dislocation and Morphology Control During Molecular-Beam Epitaxy of AlGaN/GaN Heterostructures Directly on Sapphire Substrates', Applied Physics Letters, vol. 81, No. 8, 2002, pp. 1456-1458.

Marchand et al., 'Microscructure of GaN Laterally Overgrown by Metalorganic Chemical Vapor Deposition', Applied Physics Letters, vol. 73, No. 6, 1998, pp. 747-749.

Nakamura et al., 'GaN Growth Using GaN Buffer Layer', Japanese Journal of Applied Physics, vol. 30, No. 10A, 1991, pp. L1705-L1707.

Park et al., 'Selective-Area and Lateral Epitaxial Overgrowth of III-N Materials by Metal Organic Chemical Vapor Deposition', Applied Physics Letters, vol. 73, No. 3, 1998, pp. 333-335.

International Search Report & Written Opinion of PCT Application No. PCT/US2009/046252, dated Jul. 29, 2009, 12 pages total.

International Search Report of PCT Application No. PCT/US2009/049725, dated Sep. 1, 2009, 17 pages total.

International Search Report & Written Opinion of PCT Application No. PCT/US2009/054952, dated Oct. 21, 2009, 15 pages total.

International Search Report & Written Opinion of PCT Application No. PCT/US2009/056546, dated Nov. 2, 2009, 13 pages total.

International Search Report & Written Opinion of PCT Application No. PCT/US2010/052175, dated Jan. 6, 2011, 3 total pages.

Romanov et al., 'Stress Relaxation in Mismatched Layers Due to Threading Dislocation Inclination', Applied Physics Letter, vol. 83, No. 13, 2003, pp. 2569-2571.

Stutzmann et al., 'Playing With Polarity', Physics Status Solidi, vol. 228, No. 2, 2001, pp. 505-512.

Sumiya et al., 'Growth Mode and Surface Morphology of a GaN Film Deposited Along The N-Face Polar Direction on c-Plane Sapphire Substrate', Journal of Applied Physics, vol. 88, No. 2, 2000, pp. 1158-1165.

Sumiya et al., 'Review of Polarity Determination and Control of GaN', MRS Internet Journal Nitride Semiconductor Research, vol. 9, No. 1, 2004, pp. 1-34.

(56) References Cited

OTHER PUBLICATIONS

Communication from the Japanese Patent Office re 2011-053647 dated Sep. 17, 2014 (8 pages).
Waltereit et al., 'Structural Properties of GaN Buffer Layers on 4H-SiC(0001) Grown by Plasma-Assisted Molecular Beam Epitaxy for High Electron Mobilty Transistors', Japanese Journal of Applied Physics, vol. 43, No. 12-A, 2004, pp. L1520-L1523.
Weyher et al., 'Morphological and Structural Characteristics of Homoepitaxial GaN Grown by Metalorganic Chemical Vapour Deposition (MOCVD)', Journal of Crystal Growth, vol. 204, 1999, pp. 419-428.
Xu et al., 'Polarity Control of GaN Grown on Sapphire Substrate by RF-MBE', Journal of Crystal Growth, vol. 237-239, Pt. 2, 2002, pp. 1003-1007.
USPTO Office Action for U.S. Appl. No. 12/636,683 dated Nov. 17, 2014 (16 pages).
USPTO Office Action for U.S. Appl. No. 12/988,772 dated Dec. 5, 2014 (10 pages).
USPTO Office Action for U.S. Appl. No. 13/343,563 dated Oct. 8, 2014 (5 pages).
USPTO Office Action for U.S. Appl. No. 13/538,426 dated Nov. 21, 2014 (15 pages ).
USPTO Notice of Allowance for U.S. Appl. No. 13/894,220 dated Dec. 9, 2014 (8 pages).
USPTO Office Action for U.S. Appl. No. 12/133,365 dated Feb. 20, 2014, 32 pages.
USPTO Office Action for U.S. Appl. No. 12/636,683 dated Feb. 24, 2014, 16 pages.
USPTO Notice of Allowance for U.S. Appl. No. 13/272,981 dated Mar. 13, 2014, 10 pages.
Communication from the Japanese Patent Office re 2011-134782 dated Dec. 26, 2014 (9 pages).
USPTO Notice of Allowance for U.S. Appl. No. 13/343,563 dated Dec. 17, 2014 (7 pages).
USPTO Office Action for U.S. Appl. No. 13/538,426 dated Mar. 19, 2015 (16 pages).
USPTO Office Action for U.S. Appl. No. 13/556,105 dated Mar. 13, 2015 (6 pages).
Byrappa et al., 'Handbook of Hydrothermal Technology: A Technology for Crystal Growth and Materials Processing', Noyes Publications, Park Ridge, New Jersey, 2001, pp. 94-96 and 152.
Callahan et al., 'Synthesis and Growth of Gallium Nitride by The Chemical Vapor Reaction Process (CVRP)', MRS Internet Journal Nitride Semiconductor Research', vol. 4, No. 10, 1999, pp. 1-6.
Chiang et al., 'Luminescent Properties of Cerium-Activated Garnet Series Phosphor: Structure and Temperature Effects', Journal of the Electrochemical Society, vol. 155, No. 6, 2008, pp. B517-B520.
Chiu et al., 'Synthesis and Luminescence Properties of Intensely Red-Emitting M5Eu(WO4)4-x(MoO4)x(M = Li, Na, K) Phosphors', Journal of the Electrochemical Society, vol. 155, No. 3, 2008, pp. J71-J78.
Choi et al., '2.51 microcavity InGaN light-emitting diodes fabricated by a selective dry-etch thinning process', Applied Physics Letters, 2007, 91(6), 061120.
Ci et al., 'Ca1-xMo1-ySiyO4:Eux3+: A Novel Red Phosphor for White Light Emitting Diodes', Physica B, vol. 403, 2008, pp. 670-674.
D'Evelyn et al., 'Bulk GaN Crystal Growth by the High-Pressure Ammonothermal Method', Journal of Crystal Growth, vol. 300, 2007, pp. 11-16.
Dwilinski et al., 'Ammono Method of BN, AlN and GaN Synthesis and Crystal Growth', MRS Internet Journal Nitride Semiconductor Research, vol. 3, No. 25, 1998, pp. 1-5.
Dwilinski et al., 'Excellent Crystallinity of Truly Bulk Ammonothermal GaN', Journal of Crystal Growth, vol. 310, 2008, pp. 3911-3916.
Ehrentraut et al., 'The ammonothermal crystal growth of gallium nitride-A technique on the up rise', Proceedings IEEE, 2010, 98(7), pp. 1316-1323.

Fang., 'Deep centers in semi-insulating Fe-doped native GaN substrates grown by hydride vapour phase epitaxy', Physica Status Solidi, vol. 5, No. 6, 2008, pp. 1508-1511.
Farrell et al., 'Continuous-Wave Operation of AlGaN-Cladding-Free Nonpolar m-Plane InGaN/GaN Laser Diodes', 2007, Japanese Journal of Applied Physics, vol. 46, No. 32, 2007, pp. L761-L763.
Feezell et al., 'AlGaN-Cladding-Free Nonpolar InGaN/GaN Laser Diodes', Japanese Journal of Applied Physics, vol. 46, No. 13, 2007, pp. L284-L286.
Frayssinet et al., 'Evidence of Free Carrier Concentration Gradient Along the c-Axis for Undoped GaN Single Crystals', Journal of Crystal Growth, vol. 230, 2001, pp. 442-447.
Fujito et al., 'Development of Bulk GaN Crystals and Nonpolar/Semipolar Substrates by HVPE', MRS Bulletin, May 2009, vol. 34, No. 5, pp. 313-317.
Fukuda et al., 'Prospects for the Ammonothermal Growth of Large GaN Crystal', Journal of Crystal Growth, vol. 305, 2007, pp. 304-310.
Gladkov et al., 'Effect of Fe doping on optical properties of freestanding semi-insulating HVPE GaN:Fe', Journal of Crystal Growth, 312, pp. 1205-1209.
Happek, 'Development of Efficient UV-LED Phosphor Coatings for Energy Saving Solid State Lighting', University of Georgia, 2007, 22 pages.
Hashimoto et al., 'A GaN bulk crystal with improved structural quality grown by the ammonothermal method', Nature Materials, vol. 6, 2007, pp. 568-671.
Hashimoto et al., 'Ammonothermal Growth of Bulk GaN', Journal of Crystal Growth, vol. 310, 2008, pp. 3907-3910.
Hoppe et al., 'Luminescence in Eu2+-Doped Ba2Si5N8: Fluorescence, Thermoliminescence, and Upconversion', Journal of Physics and Chemistry of Solids, vol. 61, 2000, pp. 2001-2006.
Iso et al., 'High Brightness Blue InGaN/GaN Light Emitting Diode on Nonpolar m-Plane Bulk GaN Substrate', Japanese Journal of Applied Physics, vol. 46, No. 40, 2007, pp. L960-L962.
Kim et al., 'Improved Electroluminescence on Nonpolar m-Plane InGaN/GaN Qantum Well LEDs', Rapid Research Letters, vol. 1, No. 3, 2007, pp. 125-127.
Kojima et al., 'Stimulated Emission at 474 nm From an InGaN Laser Diode Structure Grown on a (1122) GaN Substrate', Applied Physics Letters, vol. 91, 2007, pp. 251107-251107-3.
Kolis et al., 'Materials Chemistry and Bulk Crystal Growth of Group III Nitrides in Supercritical Ammonia', Material Resources Society Symposium Proceedings, vol. 495, 1998, pp. 367-372.
Kolis et al., 'Crystal Growth of Gallium Nitride in Supercritical Ammonia', Journal of Crystal Growth, vol. 222, 2001, pp. 431-434.
Kubota et al., 'Temperature Dependence of Polarized Photoluminescence From Nonpolar m-Plane InGaN Multiple Quantum Wells for Blue Laser Diodes', Applied Physics Letter, vol. 92, 2008, pp. 011920-1-011920-3.
Li et al., 'The Effect of Replacement of Sr by Ca OnThe Structural and Luminescence Properties of the Red-Emitting Sr2Si5N8:Eu2+ LED Conversion Phosphor', Journal of Solid State Chemistry, vol. 181, 2007, pp. 515-524.
Lide et al., 'Thermal Conductivity of Ceramics and Other Insulating Materials', CRC Handbook of Chemistry and Physics, 91st Edition, 2010-2011, pp. 12-203 and 12-204.
http://www.matbase.com/material/non-ferrous-metals/other/molybdenum/properties, Data Table for: Non-Ferrous Metals: Other Metals: Molybdenum, Mar. 28, 2011, pp. 1.
Mirwald et al., 'Low-Friction Cell for Piston-Cylinder High Pressure Apparatus', Journal of Geophysical Research, vol. 80, No. 11, 1975, pp. 1519-1525.
Motoki et al., 'Growth and Characterization of Freestanding GaN Substrates', Journal of Crystal Growth, vol. 237-239, 2002, pp. 912-921.
Mueller-Mach et al., 'Highly Efficient All-Nitride Phosphor-Converted White Light Emitting Diode', Physica Status Solidi (a), vol. 202, 2005, pp. 1727-1732.
Murota et al., 'Solid State Light Source Fabricated With YAG:Ce Single Crystal', Japanese Journal of Applied Physics, vol. 41, Part 2, No. 8A, 2002, pp. L887-L888.

(56) References Cited

OTHER PUBLICATIONS

Okamoto et al., 'Continuous-Wave Operation of m-Plane InGaN Multiple Quantum Well Laser Diodes', Japanese Journal of Applied Physics, vol. 46, No. 9, 2007, pp. L187-L189.
Okamoto et al., 'Pure Blue Laser Diodes Based on Nonpolar m-Plane Gallium Nitride With InGaN Waveguiding Layers', Japanese Journal of Applied Physics, vol. 46, No. 35, 2007, pp. L820-L822.
Oshima et al., 'Thermal and Optical Properties of Bulk GaN Crystals Fabricated Through Hydride Vapor Phase Epitaxy With Void-Assisted Separation', Journal of Applied Physics, vol. 98, No. 10, Nov. 18, 2005, pp. 103509-1-103509-4.
Pattison et al., 'Gallium Nitride Based Microcavity Light Emitting Diodes With 2? Effective Cavity Thickness', Applied Physics Letters, vol. 90, Issue 3, 031111 (2007) 3pg.
International Search Report of PCT Application No. PCT/US2009/048489, dated Sep. 14, 2009, 12 pages total.
International Search Report & Written Opinion of PCT Application No. PCT/US2009/067745, dated Feb. 5, 2010, 9 pages total.
Peters, 'Ammonothermal Synthesis of Aluminium Nitride', Journal of Crystal Growth, vol. 104, 1990, pp. 411-418.
Porowski, 'High Resistivity GaN Single Crystalline Substrates', Acta Physica Polonica A, vol. 92, No. 2, 1997, pp. 958-962.
Roder et al., 'Temperature dependence of the thermal expansion of GaN', Physics Review B, vol. 72., No. 085218, Aug. 24, 2005.
Sarva et al., 'Dynamic Compressive Strength of Silicon Carbide Under Uniaxial Compression', Material Sciences and Engineering, vol. A317, 2001, pp. 140-144.
Sato et al., 'High Power and High Efficiency Green Light Emitting Diode on Free-Standing Semipolar (1122) Bulk GaN Substrate', Physica Status Solidi (RRL), vol. 1, No. 4, 2007, pp. 162-164.
Sato et al., 'Optical Properties of Yellow Light-Emitting Diodes Grown on Semipolar (1122) Bulk GaN Substrate', Applied Physics Letters, vol. 92, No. 22, 2008, pp. 221110-1-221110-3.
Schmidt et al., 'Demonstration of Nonpolar m-Plane InGaN/GaN Laser Diodes', Japanese Journal of Applied Physics, vol. 46, No. 9, 2007, pp. L190-L191.
Setlur et al., 'Crystal Chemistry and Luminescence of Ce3+-Doped (Lu2CaMg2(Si,Ge)3O12 and Its Use in LED Based Lighting', Chemistry of Materials, vol. 18, 2006, pp. 3314-3322.
Sizov et al., '500-nm Optical Gain Anisotropy of Semipolar (1122) InGaN Quantum Wells', Applied Physics Express, vol. 2, 2009, pp. 071001-1-071001-3.
Tsuda et al., 'Blue Laser Diodes Fabricated on m-Plane GaN Substrates', Applied Physics Express, vol. 1, 2008, pp. 011104-1-011104-3.
Tyagi et al., 'Semipolar (1011) InGaN/GaN Laser Diodes on Bulk GaN Substrates', Japanese Journal of Applied Physics, vol. 46, No. 19, 2007, pp. L444-L445.
Tyagi et al., 'Partial Strain relaxation via misfit dislocation generation at heterointerfaces in (Al,In)GaN epitaxial layers grown on semipolar (1122) GaN free standing substrates', Applied Physics Letters 95, (2009) pp. 251905.
Wang et al , 'Ammonothermal Growth of GaN Crystals in Alkaline Solutions', Journal of Crystal Growth, vol. 287, 2006, pp. 376-380.
Wang et al., 'Ammonothermal Synthesis of III-Nitride Crystals', Crystal Growth & Design, vol. 6, No. 6, 2006, pp. 1227-1246.
Wang et al., 'Synthesis of Dense Polycrystaline GaN of High Purity by the Chemical Vapor Reaction Process', Journal of Crystal Growth, vol. 286, 2006, pp. 50-54.
Wang et al., 'New Red Y0.85Bi0.1Eu0.05V1-yMyO4 (M = Nb, P) Phosphors for Light-Emitting Diodes', Physica B, vol. 403, 2008, pp. 2071-2075.
Weisbuch et al., 'Recent results and latest views on microcavity LEDs', Light-Emitting Diodes: Research, Manufacturing, and Applications VIII, ed. By S.A. Stockman et al., Proc. SPIE, vol. 5366, p. 1-19 (2004).
Yamamoto, 'White LED Phosphors: The Next Step', Proceeding of SPIE, 2010, pp. 1-10.
Yang et al., 'Preparation and luminescence properties of LED conversion novel phosphors SrZnO2:Sm', Materials Letters, vol. 62, 2008, pp. 907-910.
Zhong et al., 'High Power and High Efficiency Blue Light Emitting Diode on Freestanding Semipolar (1011) Bulk GaN Substrate', Applied Physics Letter, vol. 90, No. 23, 2007, pp. 233504-1233504-3.
Zhong et al., 'Demonstration of High Power Blue-Green Light Emitting Diode on Semipolar (1122) Bulk GaN Substrate', Electronics Letters, vol. 43, No. 15, 2007, pp. 825-826.
USPTO Office Action for U.S. Appl. No. 12/133,364 dated Nov. 26, 2010 (5 pages).
USPTO Office Action for U.S. Appl. No. 12/133,364 dated Jun. 1, 2011 (7 pages).
USPTO Notice of Allowance for U.S. Appl. No. 12/133,364 dated Oct. 11, 2011 (5 pages).
USPTO Office Action for U.S. Appl. No. 12/133,365 dated Jun. 9, 2011 (16 pages).
USPTO Office Action for U.S. Appl. No. 12/133,365 dated Oct. 18, 2011 (21 pages).
USPTO Office Action for U.S. Appl. No. 12/133,365 dated May 13, 2013 (22 pages).
USPTO Office Action for U.S. Appl. No. 12/334,418 dated Apr. 5, 2011 (19 pages).
USPTO Office Action for U.S. Appl. No. 12/334,418 dated Oct. 19, 2011 (23 pages).
USPTO Office Action for U.S. Appl. No. 12/478,736 dated Sep. 27, 2011 (10 pages).
USPTO Office Action for U.S. Appl. No. 12/478,736 dated Feb. 7, 2012 (6 pages).
USPTO Notice of Allowance for U.S. Appl. No. 12/478,736 dated Apr. 23, 2012 (7 pages).
USPTO Notice of Allowance for U.S. Appl. No. 12/478,736 dated Oct. 9, 2012 (4 pages).
USPTO Office Action for U.S. Appl. No. 12/484,095 dated Nov. 10, 2010 (8 pages).
USPTO Office Action for U.S. Appl. No. 12/484,095 dated Jul. 8, 2011 (11 pages).
USPTO Office Action for U.S. Appl. No. 12/491,176 dated Mar. 1, 2012 (9 pages).
USPTO Office Action for U.S. Appl. No. 12/497,969 dated Feb. 2, 2012 (19 pages).
USPTO Office Action for U.S. Appl. No. 12/497,969 dated Jul. 5, 2012 (17 pages).
USPTO Office Action for U.S. Appl. No. 12/497,969 dated May 16, 2013 (21 pages).
USPTO Office Action for U.S. Appl. No. 12/534,838 dated May 3, 2011 (11 pages).
USPTO Office Action for U.S. Appl. No. 12/534,838 dated Jan. 13, 2012 (12 pages).
USPTO Office Action for U.S. Appl. No. 12/534,838 dated Mar. 20, 2012 (12 pages).
USPTO Notice of Allowance for U.S. Appl. No. 12/534,838 dated Jun. 8, 2012 (8 pages).
USPTO Office Action for U.S. Appl. No. 12/534,843 dated Sep. 10, 2012 (9 pages).
USPTO Notice of Allowance for U.S. Appl. No. 12/534,843 dated Jan. 24, 2013 (8 pages).
USPTO Office Action for U.S. Appl. No. 12/534,844 dated Sep. 16, 2010 (8 pages).
USPTO Office Action for U.S. Appl. No. 12/534,844 dated Feb. 4, 2011 (9 pages).
USPTO Notice of Allowance for U.S. Appl. No. 12/534,849 dated Jul. 31, 2012 (11 pages).
USPTO Office Action for U.S. Appl. No. 12/534,857 dated Sep. 1, 2010 (10 pages).
USPTO Notice of Allowance for U.S. Appl. No. 12/534,857 dated May 27, 2011 (5 pages).
USPTO Office Action for U.S. Appl. No. 12/546,458 dated Jul. 20, 2011 (4 pages).
USPTO Notice of Allowance for U.S. Appl. No. 12/546,458 dated Nov. 28, 2011 (5 pages).

(56) References Cited

OTHER PUBLICATIONS

USPTO Office Action for U.S. Appl. No. 12/556,558 dated Sep. 16, 2010 (8 pages).
USPTO Notice of Allowance for U.S. Appl. No. 12/556,558 dated Mar. 22, 2011 (5 pages).
USPTO Office Action for U.S. Appl. No. 12/556,562 dated Sep. 15, 2010 (7 pages).
USPTO Office Action for U.S. Appl. No. 12/556,562 dated Mar. 21, 2011 (5 pages).
USPTO Notice of Allowance for U.S. Appl. No. 12/556,562 dated Jul. 27, 2011 (5 pages).
USPTO Office Action for U.S. Appl. No. 12/569,337 dated May 9, 2012 (18 pages).
USPTO Notice of Allowance for U.S. Appl. No. 12/569,337 dated Nov. 15, 2012 (5 pages).
USPTO Office Action for U.S. Appl. No. 12/569,841 dated Dec. 23, 2011 (12 pages).
USPTO Office Action for U.S. Appl. No. 12/569,844 dated Oct. 12, 2012 (12 pages).
USPTO Office Action for U.S. Appl. No. 12/634,665 dated Apr. 25, 2012 (10 pages).
USPTO Office Action for U.S. Appl. No. 12/634,665 dated Oct. 1, 2012 (10 pages).
USPTO Notice of Allowance for U.S. Appl. No. 12/634,665 dated Feb. 15, 2013 (9 pages).
USPTO Office Action for U.S. Appl. No. 12/636,683 dated Jun. 12, 2013 (14 pages).
USPTO Office Action for U.S. Appl. No. 12/724,983 dated Mar. 5, 2012 (20 pages).
USPTO Notice of Allowance for U.S. Appl. No. 12/754,886 dated May 17, 2012 (19 pages).
USPTO Notice of Allowance for U.S. Appl. No. 12/754,886 dated Jun. 5, 2012 (16 pages).
USPTO Notice of Allowance for U.S. Appl. No. 12/754,886 dated Jun. 20, 2012 (14 pages).
USPTO Office Action for U.S. Appl. No. 12/785,404 dated Mar. 6, 2012 (9 pages).
USPTO Notice of Allowance for U.S. Appl. No. 12/785,404 dated Jul. 16, 2012 (5 pages).
USPTO Office Action for U.S. Appl. No. 12/891,668 dated Sep. 25, 2012 (20 pages).
USPTO Office Action for U.S. Appl. No. 12/891,668 dated Jan. 10, 2013 (30 pages).
USPTO Notice of Allowance for U.S. Appl. No. 12/891,668 dated Mar. 20, 2013 (13 pages).
USPTO Office Action for U.S. Appl. No. 13/013,697 dated Jun. 9, 2014 (5 pages).
USPTO Office Action for U.S. Appl. No. 13/025,833 dated Jul. 12, 2012 (15 pages).
USPTO Office Action for U.S. Appl. No. 13/041,199 dated Nov. 30, 2012 (13 pages).
USPTO Office Action for U.S. Appl. No. 13/041,199 dated Mar. 12, 2013 (9 pages).
USPTO Office Action for U.S. Appl. No. 13/041,199 dated Apr. 29, 2014 (12 pages).
USPTO Office Action for U.S. Appl. No. 13/175,739 dated Dec. 7, 2012 (5 pages).
USPTO Notice of Allowance for U.S. Appl. No. 13/175,739 dated Mar. 21, 2013 (6 pages).
USPTO Office Action for U.S. Appl. No. 13/179,346 dated Aug. 17, 2012 (17 pages).
USPTO Office Action for U.S. Appl. No. 13/179,346 dated Dec. 13, 2012 (20 pages).
USPTO Office Action for U.S. Appl. No. 13/226,249 dated Oct. 10, 2012 (7 pages).
USPTO Notice of Allowance for U.S. Appl. No. 13/226,249 dated Feb. 21, 2013 (5 pages).
USPTO Office Action for U.S. Appl. No. 13/272,981 dated Mar. 20, 2013 (18 pages).
USPTO Office Action for U.S. Appl. No. 13/346,507 dated Dec. 21, 2012 (8 pages).
USPTO Notice of Allowance for U.S. Appl. No. 13/346,507 dated Apr. 22, 2013 (8 pages).
USPTO Notice of Allowance for U.S. Appl. No. 13/425,304 dated Aug. 22, 2012 (7 pages).
USPTO Notice of Allowance for U.S. Appl. No. 13/548,931 dated Jun. 3, 2013 (10 pages).
Communication from the Chinese Patent Office re 200980154756.9 dated Jun. 17, 2014 (10 pages).
USPTO Office Action for U.S. Appl. No. 12/484,095 dated Aug. 29, 2014 (10 pages).
USPTO Notice of Allowance for U.S. Appl. No. 13/013,697 dated Aug. 27, 2014 (5 pages).
USPTO Notice of Allowance for U.S. Appl. No. 13/041,199 dated Sep. 9, 2014 (9 pages).
USPTO Office Action for U.S. Appl. No. 13/160,307 dated Jun. 26, 2014 (19 pages).
USPTO Office Action for U.S. Appl. No. 13/894,220 dated Jul. 31, 2014 (9 pages).

* cited by examiner

LARGE AREA NITRIDE CRYSTAL AND METHOD FOR MAKING IT

CROSS REFERENCE TO RELATED APPLICATIONS

This application is a continuation-in-part of, and claims priority to U.S. application Ser. No. 13/160,307, filed on Jun. 14, 2011, which claims priority to U.S. Provisional Application No. 61/356,489, filed on Jun. 18, 2010; and to U.S. Provisional Application No. 61/386,879, filed on Sep. 27, 2010; each of which is incorporated herein by reference for all purposes.

BACKGROUND

This disclosure relates to techniques for processing materials in supercritical fluids. Embodiments of the disclosure include techniques for material processing in a capsule disposed within a high-pressure apparatus enclosure. The methods can be applied to growing crystals of GaN, AlN, InN, and their alloys, including, for example, InGaN, AlGaN, and AlInGaN, and others for the manufacture of bulk or patterned substrates. Such bulk or patterned substrates can be used for a variety of applications including optoelectronic devices, lasers, light emitting diodes, solar cells, photoelectrochemical water splitting and hydrogen generation devices, photodetectors, integrated circuits, and transistors, among other devices.

Large area, high quality crystals and substrates, for example, nitride crystals and substrates, are needed for a variety of applications, including light emitting diodes, laser diodes, transistors, and photodetectors. In general, there is an economy of scale with device processing, such that the cost per device is reduced as the diameter of the substrate is increased. In addition, large area seed crystals are needed for bulk nitride crystal growth.

There are known methods for fabrication of large area gallium nitride (GaN) crystals with a (0 0 0 1) c-plane orientation. In many cases, hydride vapor phase epitaxy (HVPE) is used to deposit thick layers of gallium nitride on a non-gallium-nitride substrate such as sapphire, followed by the removal of the substrate. These methods have demonstrated capability for producing free-standing c-plane GaN wafers 50-75 millimeters in diameter, and it is expected that GaN wafers with diameters as large as 100 millimeter can be produced. The typical average dislocation density, however, in these crystals, about $10^6$-$10^8$ cm$^{-2}$, is too high for many applications. Techniques have been developed to gather the dislocations into bundles or low-angle grain boundaries, but it is still very difficult to produce dislocation densities below $10^4$ cm$^{-2}$ in a large area single grain by these methods, and the relatively high concentration of high-dislocation-density bundles or grain boundaries creates difficulties such as performance degradation and/or yield losses for the device manufacturer.

The non-polar planes of gallium nitride, such as $\{1\ 0\ \bar{1}\ 0\}$ and $\{1\ 1\ \bar{2}\ 0\}$, and the semi-polar planes of gallium nitride, such as $\{1\ 0\ \bar{1}\ \pm 1\}$, $\{1\ 0\ \bar{1}\ \pm 2\}$, $\{1\ 0\ \bar{1}\ \pm 3\}$, and $\{1\ 1\ \bar{2}\ \pm 2\}$, $\{2\ 0\ \bar{2}\ 1\}$ are attractive for a number of applications. Unfortunately, no large area, high quality non-polar or semi-polar GaN wafers are generally available for large scale commercial applications. Other conventional methods for growing very high quality GaN crystals, for example, with a dislocation density less than $10^4$ cm$^{-2}$ have been proposed. These crystals, however, are typically small, less than 1–5 centimeters in diameter, and are not commercially available.

Legacy techniques have suggested a method for merging elementary GaN seed crystals into a larger compound crystal by a tiling method. Some of the legacy methods use elementary GaN seed crystals grown by hydride vapor phase epitaxy (HVPE) and polishing the edges of the elementary crystals at oblique angles to cause merger in fast-growing directions. Such legacy techniques, however, have limitations. For example, legacy techniques do not specify the accuracy of the crystallographic orientation between the merged elementary seed crystals they provide a method capable of producing highly accurate crystallographic registry between the elementary seed crystals and the observed defects resulting from the merging of the elementary seed crystals.

Conventional techniques are inadequate for at least the reason of failing to meaningfully increase the available size of high-quality nitride crystals while maintaining extremely accurate crystallographic orientation across the crystals.

BRIEF SUMMARY OF THE DISCLOSURE

This disclosure provides a method for growth of a large-area, gallium-containing nitride crystal. The method includes providing at least two nitride crystals having a dislocation density below about $10^7$ cm$^{-2}$ together with a handle substrate. The nitride crystals are bonded to the handle substrate. Then, the nitride crystals are grown to coalescence into a merged nitride crystal. The polar misorientation angle $\gamma$ between the first nitride crystal and the second nitride crystal is greater than about 0.005 degree and less than about 0.5 degree and the azimuthal misorientation angles $\alpha$ and $\beta$ are greater than about 0.01 degree and less than about 1 degree. A semiconductor structure can be formed on the nitride crystals as desired.

In another embodiment, the disclosure includes the steps above, and also includes methods of providing a release layer and a high quality epitaxial layer on each of the two nitride crystals. The epitaxial layers are grown to cause coalescence of the two nitride crystals into a merged nitride crystal. The polar misorientation angle $\gamma$ between the first nitride crystal and the second nitride crystal is less than 0.5 degree and azimuthal misorientation angles $\alpha$ and $\beta$ are less than 1 degree.

The disclosed methods can provide a crystal that includes at least two single crystal domains having a nitride composition and characterized by a dislocation density within each of the domains of less than $10^7$ cm$^{-2}$. Each of the at least two single crystal domains is separated by a line of dislocations with a linear density greater than 50 cm$^{-1}$ and less than $5\times10^5$ cm$^{-1}$. The polar misorientation angle $\gamma$ between the first domain and the second domain is less than 0.5 degree and the azimuthal misorientation angles $\alpha$ and $\beta$ are less than 1 degree.

In a first aspect, crystals comprising at least two single crystal domains having a nitride composition are disclosed comprising: a first domain having a first thickness, a first lateral dimension, and a second lateral dimension, wherein the first lateral dimension and the second lateral dimension define a plane that is perpendicular to the first thickness, and each of the first lateral dimension and the second lateral dimension is greater than about 2 millimeters; and a second domain having a second thickness, a third lateral dimension and a fourth lateral dimension, wherein the third lateral dimension and the fourth later dimension define a plane that is perpendicular to the second thickness, wherein each of the third lateral dimension and the fourth lateral dimension is greater than about 2 millimeters; wherein each of the at least two single crystal domains are characterized by a dislocation density of less than $10^7$ cm$^{-2}$, are separated by a line of dislocations with a linear density between about 50 cm$^{-1}$ and about $5 \times 10^5$ cm$^{-1}$, and a polar misorientation angle γ between the first domain and the second domain is greater than about 0.005 degrees and less than about 0.5 degrees and misorientation angles α and β are greater than about 0.01 degrees and less than about 1 degree.

In a second aspect, method of fabricating a crystal are disclosed, comprising: providing at least two crystals, each of the at least two crystals characterized by a dislocation density below about $10^7$ cm$^{-2}$; providing a handled substrate; bonding the at least two crystals to the handle substrate; and growing the at least two crystals to cause a coalescence into a merged crystal; wherein the merged crystal comprises a first domain and a second domain characterized by a polar misorientation angle γ between the first domain and the second domain is greater than about 0.005 degrees and less than about 0.5 degrees and the misorientation angles α and β between the first domain and the second domain are greater than about 0.01 degrees and less than about 1 degree.

DETAILED DESCRIPTION

Figure 1A:
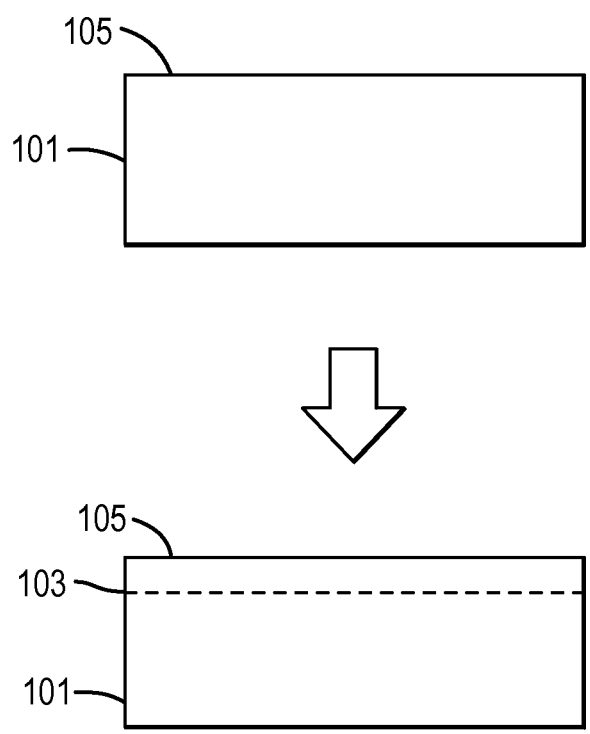
FIGS. 1A, 1B, 1C, 1D, 1E, 1F, 1G, 1H, 1I, 1J, and 1K are diagrams illustrating methods for bonding crystals.

Referring to FIG. 1A, a crystal 101 having a first surface 105 is provided. Herein discussed is a crystal, referred to as crystal 101 as a "nitride crystal", as nitride crystals with a wurtzite crystal structure, which crystal and crystal structure is discussed in detail for a particular set of embodiments. The method disclosed also uses the term "nitride crystal", which includes non-nitride crystals and nitride crystals. Examples of non-nitride crystals include diamond, cubic boron nitride, boron carbide, silicon, silicon carbide, germanium, silicon germanium, indium phosphide, gallium phosphide, zinc oxide, zinc selenide, gallium arsenide, cadmium telluride, and cadmium zinc telluride. In certain embodiments, nitride crystal 101 comprises GaN or $Al_xIn_yGa_{(1-x-y)}N$, where 0≤x and y≤1 and is characterized a very high crystallographic quality. In another embodiment, crystal 101 has a wurtzite crystal structure and is selected from ZnO, ZnS, AgI, CdS, CdSe, 2H—SiC, 4H—SiC, and 6H—SiC. Nitride crystal 101 preferably has a surface dislocation density less than about $10^7$ cm$^{-2}$, $10^6$ cm$^{-2}$, $10^5$ cm$^{-2}$, $10^4$ cm$^{-2}$, $10^3$ cm$^{-2}$, or in certain embodiments, less than about $10^2$ cm$^2$. Nitride crystal 101 also preferably has a stacking-fault concentration below $10^4$, below $10^3$ cm$^{-1}$, $10^2$ cm$^{-1}$, 10 cm$^{-1}$, or in certain embodiments, below 1 cm$^{-1}$. Nitride crystal 101 also has a symmetric x-ray rocking curve full width at half maximum (FWHM) less than about 300 arc sec, 200 arc sec, 100 arc sec, 50 arc sec, 35 arc sec, 25 arc sec, or in certain embodiments less than about 15 arc sec. Nitride crystal 101 has a crystallographic radius of curvature greater than 0.1 meter, 1 meter, 10 meters, 100 meters, or in certain embodiments, greater than 1000 meters, in up to three independent or orthogonal directions.

Nitride crystal 101 may comprise regions characterized by a relatively high concentration of threading dislocations separated by one or more regions characterized by a relatively low concentration of threading dislocations. The concentration of threading dislocations in the relatively high concentration regions may be greater than about $10^6$ cm$^{-2}$, $10^7$ cm$^{-2}$, or in certain embodiments, greater than about $10^8$ cm$^{-2}$. The concentration of threading dislocations in the relatively low concentration regions may be less than about $10^6$ cm$^{-2}$, $10^5$ cm$^{-2}$, or in certain embodiments, less than about $10^4$ cm$^{-2}$. The thickness of nitride crystal 101 may be between about 10 microns and about 100 millimeters, or in certain embodiments, between about 0.1 millimeter and about 10 millimeters. Crystal 101 may have a first lateral dimension and a second lateral dimension, the lateral dimensions defining a plane that is perpendicular to the thickness of the nitride crystal 101, where each of the first lateral dimension and the second lateral dimension may be at least about 0.5 millimeter, 1 millimeter, 2 millimeters, 4 millimeters, 5 millimeters, 10 millimeters, 15 millimeters, 20 millimeters, 25 millimeters, 35 millimeters, 50 millimeters, 75 millimeters, 100 millimeters, 150 millimeters, or in certain embodiments, at least about 200 millimeters. Surface 105 may be characterized by a crystallographic orientation within 5 degrees, within 2 degrees, within 1 degree, within 0.5 degree, within 0.2 degree, within 0.1 degree, within 0.05 degree, within 0.02 degree, or in certain embodiments, within about 0.01 degree of the (0 0 0 1) Ga-polar plane, the (0 0 0 -1) N-polar plane, the {1 0 -1 0} non-polar plane, or the {1 1 -2 0} non-polar a-plane. Surface 105 may be characterized by a (h k i l) semi-polar orientation, where i=-(h+k) and/and at least one of h and k are nonzero.

In certain embodiments, the crystallographic orientation of surface 105 is within 5 degrees, 2 degrees, 1 degree, 0.5 degree, 0.2 degree, 0.1 degree, 0.05 degree, 0.02 degree, or in certain embodiments, within 0.01 degree of any one of the {1 1 -2 ±2} plane, the {6 0 -6 ±1} plane, the {5 0 -5 ±1} plane, the {40 -4 ±1} plane, the {3 0 -3 ±1} plane, the {5 0 -5 ±2} plane, the {7 0 -7 ±3} plane, the {2 0 -2 ±1} plane, the {3 0 -3 ±2} plane, the {4 0 -4 ±3} plane, the {5 0 -5 ±4} plane, the {1 0 -1 ±1} plane, the {1 0 -1 ±2} plane, the {1 0 -1 ±3} plane, the {2 1 -3 ±1} plane, or the {3 0 -3 ±4} plane. Nitride crystal 101 may have a minimum lateral dimension of at least two millimeters, but it can be four millimeters, one centimeter, two centimeters, three centimeters, four centimeters, five centimeters, six centimeters, eight centimeters, or in certain embodiments at least ten centimeters. In other embodiments, crystal 101 is characterized by a cubic crystal structure. In some embodiments, crystal 101 has a cubic diamond structure and is selected from diamond, silicon, germanium, and silicon germanium. In other embodiments, crystal 101 is characterized by a cubic zincblende structure and is selected from cubic BN, BP, BAs, AlP, AlAs, AlSb, β-SiC, GaP, GaAs, GaSb, InP, InAs, ZnS, ZnSe, CdS, CdSe, CdTe, CdZeTe, and HgCdTe. In certain embodiments, the crystallographic orientation of surface 105 is within 5 degrees, 2 degrees, 1 degree, 0.5 degree, 0.2 degree, 0.1 degree, 0.05 degree, 0.02 degree, or in certain embodiments within 0.01 degree of one of the {1 1 1} plane, the {1 1 0} plane, the {1 0 0} plane, the {3 1 1} plane, and the {2 1 1} plane.

In some embodiments, nitride crystal 101 is grown by hydride vapor phase epitaxy (HVPE) according to known methods. In other embodiments, nitride crystal 101 is grown by molecular beam epitaxy (MBE) or metalorganic chemical vapor deposition (MOCVD). Nitride crystal 101 may be grown on a heteroepitaxial substrate such as sapphire, silicon carbide, or gallium arsenide. In some embodiments, nitride crystal 101 is grown by a flux or high temperature solution method. In one specific embodiment, nitride crystal 101 is grown in a solution comprising gallium metal at a temperature between about 1,400 degrees Celsius and about 1,600 degrees Celsius and a nitrogen pressure between about 10 kbar and about 30 kbar. In some embodiments, nitride crystal 101 is grown ammonothermally. In certain embodiments, nitride crystal 101 is characterized by an atomic impurity concentration of hydrogen (H) greater than about $1\times10^{16}$ cm$^{-3}$, greater than about $1\times10^{17}$ cm$^{-3}$, or greater than about $1\times10^{18}$ cm$^{-3}$. In certain embodiments, a ratio of the atomic impurity concentration of H to an atomic impurity concentration of oxygen (O) is between about 1.1 and about 1000, or between about 5 and about 100. In some embodiments, nitride crystal 101 is characterized by an impurity concentration greater than about $10^{15}$ cm$^{-1}$ of at least one of Li, Na, K, Rb, Cs, Mg, Ca, F, and Cl. In some embodiments, nitride crystal 101 is characterized by an impurity concentration greater than about $10^{14}$ cm$^{-1}$ of at least one of Be, Mg, Ca, Sr, Ba, Sc, Y, a rare earth element, Ti, Zr, Hf, V, Nb, Ta, Cr, Mo, and W. In certain embodiments, nitride crystal 101 is characterized by an impurity concentration of O, H, carbon (C), Na, and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, below $1\times10^{16}$ cm$^{-3}$, and below $1\times10^{16}$ cm$^{-3}$, respectively, as quantified by calibrated secondary ion mass spectrometry (SIMS). In another embodiment, nitride crystal 101 is characterized by an impurity concentration of O, H, C, and at least one of Na and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively, as quantified by calibrated secondary ion mass spectrometry (SIMS). In still another embodiment, nitride crystal 101 his characterized by an impurity concentration of O, H, C, and at least one of F and Cl between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $1\times10^{15}$ cm$^{-3}$ and $1\times10^{17}$ cm$^{-3}$, respectively, as quantified by calibrated secondary ion mass spectrometry (SIMS). In some embodiments, nitride crystal 101 is characterized by an impurity concentration of H between about $5\times10^{17}$ cm$^{-3}$ and $1\times10^{19}$ cm$^{-3}$, as quantified by calibrated secondary ion mass spectrometry (SIMS). In certain embodiments, nitride crystal 101 is characterized by an impurity concentration of copper (Cu), manganese (Mn), and iron (Fe) between about $1\times10^{16}$ cm$^{-3}$ and $1\times10^{19}$ cm$^{-3}$.

Figure 8:
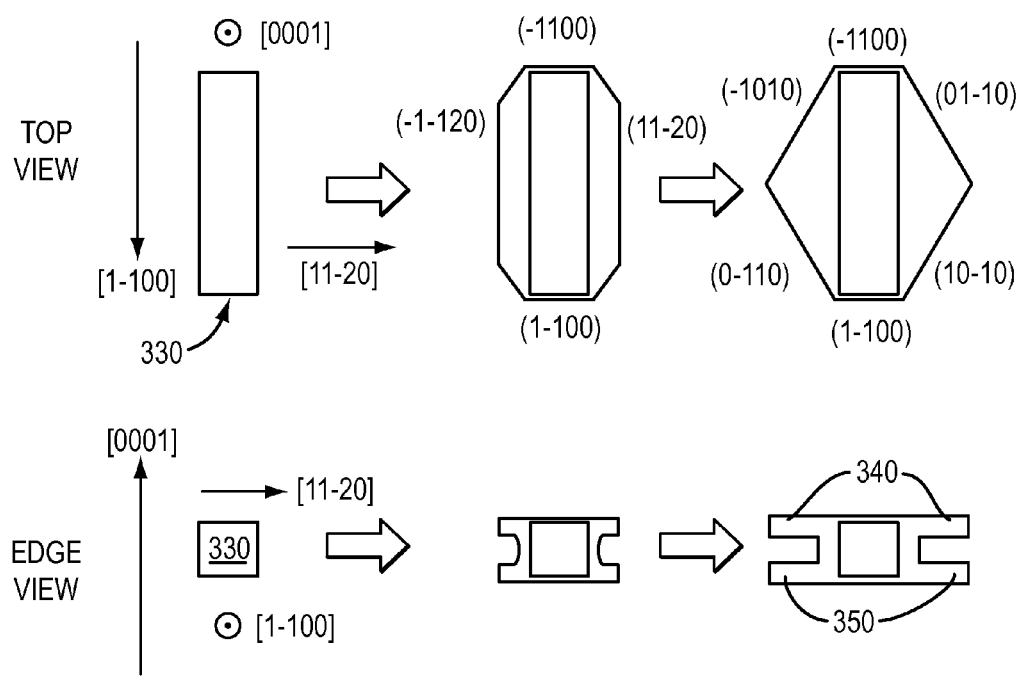
FIGS. 8, 9, and 10 are diagrams illustrating lateral growth from a seed crystal.
Figure 9:
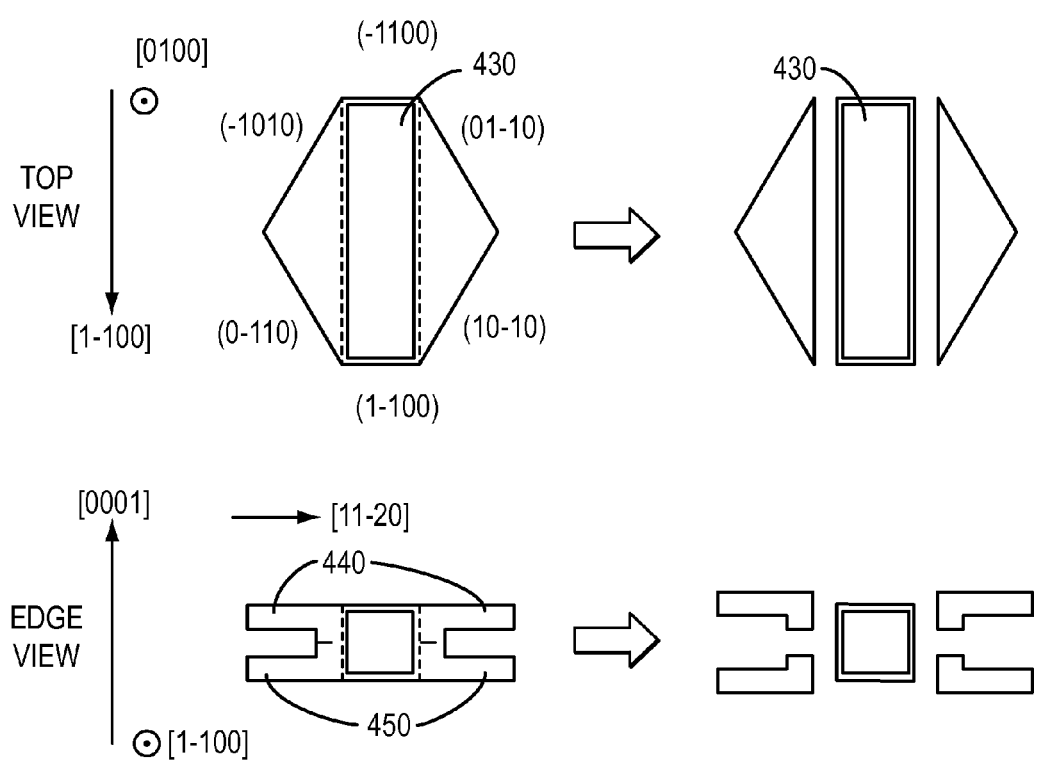
Figure 10:
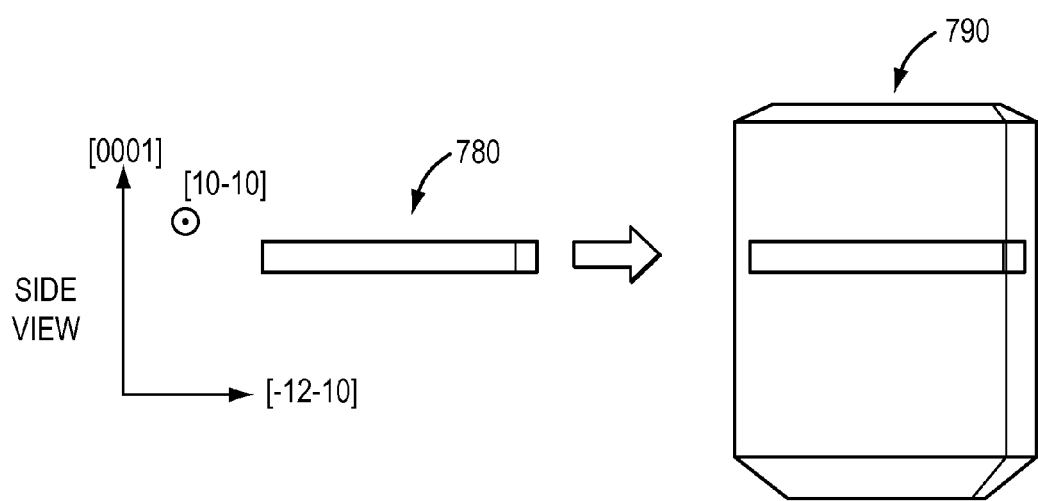

One of the steps in the preparation of nitride crystal 101 can be lateral growth from a seed crystal. Referring to FIG. 8, in certain embodiments a bar-shaped c-plane seed crystal 330 having two a-plane-oriented edges is provided. Ammonothermal growth may be performed, using conditions that favor rapid growth in the a-direction, to produce laterally-grown wings (e.g., wing 340 and wing 350). As shown in FIG. 9, the laterally-grown wings 440 and 450 may be separated from the seed crystal, producing crystals 430 with a shape approximating a half-rhombus. Referring to FIG. 10, in certain embodiments a bar-shaped m-plane seed crystal 780 having +c and −c-plane-oriented edges is provided. Ammonothermal growth may be performed, using conditions that favor rapid growth in the +c- and/or −c-directions, producing laterally-grown crystal 790. If desired, the laterally-grown wings may be separated.

In certain embodiments, nitride crystal 101 may be substantially free of stacking faults. The concentrations of threading dislocations and stacking faults can be quantified on polar (±c-plane) and nonpolar (e.g., m-plane) and a range of semipolar planes, on both HVPE GaN and ammonothermal GaN, by etching in a molten salt comprising one or more of NaOH and KOH, or in a solution comprising one or more of $H_3PO_4$ and $H_3PO_4$ that has been conditioned by prolonged heat treatment to form polyphosphoric acid, and $H_2SO_4$, at temperatures between about 100 degrees Celsius and about 500 degrees Celsius for times between about 5 minutes and about 5 hours; where the processing temperature and time are selected so as to cause formation of etch pits with diameters between about 1 micrometer and about 25 micrometers. Large area nonpolar and semipolar nitride crystals that are substantially free of stacking faults, that is, where the stacking fault concentration is below about $10^3$ cm$^{-1}$, below about $10^2$ cm$^{-1}$, below about 10 cm$^{-1}$, or below about 1 cm$^{-1}$, may be prepared by extended ammonothermal lateral growth from a seed crystal to form a wing or sector followed by separation of the laterally-grown wing or sector from the seed and removal of residual defective material from the laterally-grown wing or sector.

Referring again to FIG. 1A, in some embodiments, the conditions for the final growth step of crystal 101 are chosen so that the crystal grows to the nominal orientation and is highly flat. For example, the growth condition may be chosen so that the growth rates in directions parallel to surface 105 are greater, by at least a factor of 2, a factor of 5, a factor of 10, a factor of 20, or a factor of 50, than the growth rate perpendicular to surface 105. Establishing an on-axis orientation by direct growth may be particularly advantageous when surface 105 has an orientation selected from the (0 0 0 1) Ga-polar plane, the (0 0 0 −1) N-polar plane, the {1 0 −1 0} non-polar plane, and the {1 0 −1 ±1} semi-polar plane. Additional steps in the preparation of nitride crystal 101 and of surface 105 may include grinding, dicing, sawing, lapping, polishing, dry etching, and chemical mechanical polishing. Surface 105 may be optically flat, with a deviation from flatness less than 1 micron, 0.5 micron, 0.2 micron, 0.1 micron, or in certain embodiments less than 0.05 micron. Surface 105 may be smooth, with a root-mean-square roughness less than 5 nanometers, 2 nanometers, 1 nanometer, 0.5 nanometers, 0.2 nanometer, 0.1 nanometer, or in certain embodiments less than 0.05 nanometer, measured over an area of at least 10 microns×10 microns.

In some embodiments, at least one edge, at least two edges, or at least three edges of nitride crystal 101 are as-grown. In some embodiments, at least one edge, at least two edges, or at least three edges of nitride crystal 101 are cleaved. In some embodiments, at least one edge, at least two edges, or at least three edges of nitride crystal 101 are diced, sawed, ground, lapped, polished, and/or etched, for example, by reactive ion etching (RIE) or inductively-coupled plasma (ICP). In one specific embodiment, one or more edges of the surface of crystal 101 are defined by etching one or more trenches in a larger crystal. In some embodiments, at least one edge, at least two edges, or at least three edges of nitride crystal 101 have a {1 0 −1 0} m-plane orientation. In one specific embodiment, nitride crystal 101 has a substantially hexagonal shape. In another specific embodiment, nitride crystal 101 has a substantially rhombus or half-rhombus shape. In still other embodiments, nitride crystal 101 is substantially rectangular. In one specific embodiment, nitride crystal 101 has a (0 0 0 1) +c-plane edge and a (0 0 0 −1) −c-plane edge. In another specific embodiment, nitride crystal 101 has two {1 1 −2 0} edges. In yet another specific embodiment, nitride crystal 101 has two {1 0 −1 0} edges. In still another specific embodiment, crystal 101 has a cubic crystal structure and at least one edge, at least two edges, or at least three edges have a {111} orientation. In yet another, specific embodiment, crystal 101 has a cubic zincblende crystal structure and at least one edge, at least two edges, or at least three edges have a {110} orientation.

Referring to FIG. 1A, in one set of embodiments, surface 105 of nitride crystal 101 is implanted with ions, forming an implanted/damaged region 103 according to methods that are known in the art. The ion implantation may be performed with at least one of $H^+$, $H_2^+$, $He^+$, $Ne^+$, $Ar^+$, $Kr^+$, $Xe^+$, $N^+$, and $N_2^+$. The implantation energy can be between about 10 keV and about 1 MeV, or in certain embodiments, between about 20 keV and about 200 keV. The ion fluence or dose may be between about $10^{16}$ $cm^{-2}$ and about $10^{19}$ $cm^{-2}$, between about $10^{17}$ $cm^{-2}$ and about $10^{18}$ $cm^{-2}$, or between about $2\times10^{17}$ $cm^{-2}$ and about $4\times10^{17}$ $cm^{-2}$. In some embodiments, the back side of crystal 101 is also implanted with ions, forming a second implanted/damaged region (not shown), with a similar ion composition, energy, and fluence, so as to minimize bow in crystal 101.

Figure 1B:
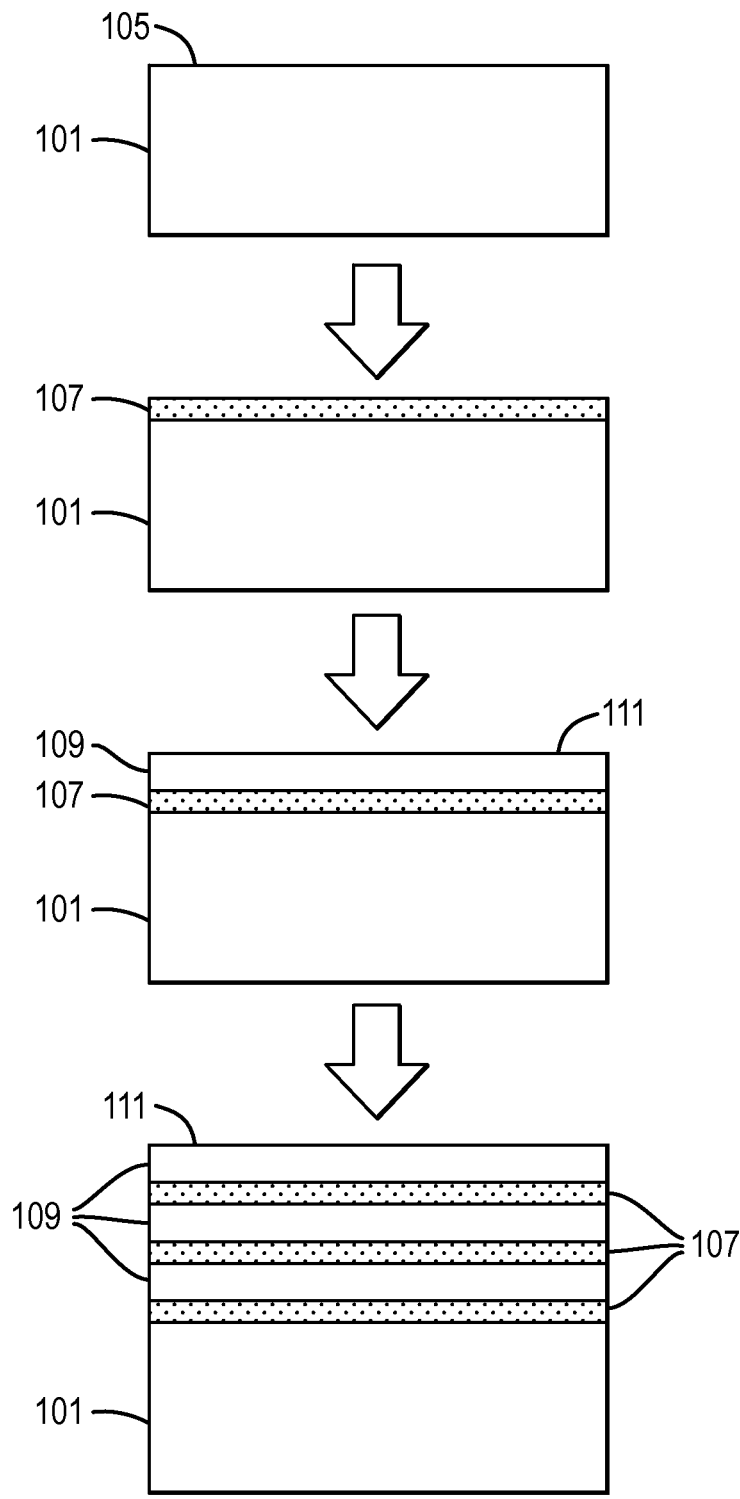

Referring to FIG. 1B, in some embodiments a release layer 107 is provided. In some embodiments, release layer 107 is characterized by an optical absorption coefficient greater than 1,000 $cm^{-1}$ at least one wavelength where nitride crystal 101 having surface 105 is substantially transparent, for example, where nitride crystal 101 is characterized by an optical absorption coefficient less than 50 $cm^{-1}$. In some embodiments, the release layer is characterized by an optical absorption coefficient greater than 5,000 $cm^{-1}$ at least one wavelength where nitride crystal 101 is substantially transparent. In some embodiments, release layer 107 can be selectively wet etched, electrochemically etched, or photoelectrochemically etched preferentially with respect to crystal 101 and with respect to high quality epitaxial layer 109 overlying release layer 107. In some embodiments, the release layer comprises $Al_xIn_yGa_{1-x-y}N$, where $0 \le x$, y, $x+y \le 1$. In some embodiments the release layer further comprises at least one impurity to render the release layer strongly absorbing at some wavelengths. A number of dopant impurities, including H, O, C, Mn, Fe, and Co, may render an $Al_xIn_yGa_{1-x-y}N$ or GaN crystal absorbing at visible wavelengths. Heavy doping with cobalt, in particular, can render GaN black, that is, with a high optical absorption coefficient across the visible spectrum. In particular, the optical absorption coefficient may be greater than 5,000 $cm^{-1}$ across the entire visible spectrum, including the range between about 465 nm and about 700 nm. The optical absorption coefficient may also be greater than 5,000 $cm^{-1}$ between about 700 nm and about 3,077 nm and at wavelengths between about 3,333 nm and about 6,667 nm. Incorporation of In can decrease the bandgap of GaN, leading to strong absorption at wavelengths where GaN or AlGaN is substantially transparent. However, the InGaN has inferior temperature stability and a larger lattice mismatch with respect to GaN or AlGaN than does heavily-doped GaN or AlGaN. Release layer 107 may be deposited epitaxially on nitride crystal 101 by metalorganic chemical vapor deposition (MOCVD), hydride vapor phase epitaxy (HVPE), molecular beam epitaxy (MBE), ammonothermal growth, or flux growth, as described in U.S. Pat. No. 8,148,801, which is incorporated by reference in its entirety.

In certain embodiments, the release layer 107 comprises nitrogen and at least one element selected from Si, Sc, Ti, V, Cr, Y, Zr, Nb, Mo, a rare earth element, Hf, Ta, and W. A metal layer may be deposited on the base crystal, to a thickness between about 1 nm and about 1 micron by sputtering, thermal evaporation, e-beam evaporation, or the like. The metal layer may then be nitrided by heating in a nitrogen-containing atmosphere such as ammonia at a temperature between about 600 degrees Celsius and about 1,200 degrees Celsius. During the nitridation process the metal partially de-wets from the base crystal, creating nano-to-micro openings through which high quality epitaxy can take place. The nitridation step may be performed in an MOCVD reactor, in an HVPE reactor, or in an ammonothermal reactor immediately prior to deposition of a high quality epitaxial layer.

In certain embodiments, the release layer 107 comprises $Al_xIn_yGa_{1-x-y}N$, where $0 \le x$, y, $x+y \le 1$, but may not have an optical absorption coefficient larger than that of nitride crystal 101. In a particular embodiment, nitride crystal 101 comprises GaN and release layer 107 comprises $Al_{1-x}In_xN$, where x is approximately equal to 0.17 so that the release layer is lattice-matched to nitride crystal 101, also known as the nitride base crystal.

Referring to FIG. 1B, a high quality epitaxial layer 109 may be provided overlying release layer 107. In some embodiments, the high quality epitaxial layer 109 is grown in a separate step, by MOCVD, by MBE, or by HVPE, after deposition of the release layer. In another embodiment, the high quality epitaxial layer is grown ammonothermally. The high quality epitaxial layer 109 may have a thickness between about 0.05 micron and about 500 microns. In some embodiments, the thickness of the high quality epitaxial layer is between about one micron and about 50 microns.

The high quality epitaxial layer 109 has the same crystallographic orientation as nitride crystal 101, to within about 0.5 degree, within 0.2 degree, within 0.1 degree, within 0.05 degree, within 0.02 degree, or within 0.01 degree, and very similar crystallographic properties. High quality epitaxial layer 109 may be between 0.1 micron and 50 microns thick, comprises nitrogen and may have a surface dislocation density below $10^7$ $cm^{-2}$. In particular embodiments, high quality epitaxial layer 109 comprises GaN or $Al_xIn_yGa_{(1-x-y)}N$, where $0 \le x$, $y \le 1$ and is characterized by high crystallographic quality. High quality epitaxial layer 109 may be characterized by a surface dislocation density less than about $10^7$ $cm^{-2}$, less than about $10^6$ $cm^{-2}$, less than about $10^5$ $cm^{-2}$, less than about $10^4$ $cm^{-2}$, less than about $10^3$ $cm^2$, or less than about $10^2$ $cm^{-2}$. High quality epitaxial layer 109 may be characterized by a stacking-fault concentration below $10^3$ $cm^{-1}$, below $10^2$ $cm^{-1}$, below 10 $cm^{-1}$ or below 1 $cm^{-1}$. High quality epitaxial layer 109 may be characterized by a symmetric x-ray rocking curve full width at half maximum (FWHM) less than about 300 arc sec, less than about 200 arc sec, less than about 100 arc sec, less than about 50 arc sec, less than about 35 arc sec, less than about 25 arc sec, or less than about 15 arc sec. In some embodiments, the high quality epitaxial layer is substantially transparent, with an optical absorption coefficient below 100 $cm^{-1}$, below 50 $cm^{-1}$, below 5 $cm^{-1}$, or below 1 $cm^{-1}$ at wavelengths between about 700 nm and about 3,077 nm and at wavelengths between about 3,333 nm and about 6,667 nm. In some embodiments, the high quality epitaxial layer is substantially free of low angle grain boundaries, or tilt boundaries. In other embodiments, the high quality epitaxial layer comprises at least two tilt boundaries, with the separation between adjacent tilt boundaries not less than 3 mm. The high quality epitaxial layer may have impurity concentrations of O, H, C, Na, and K below $1 \times 10^{17}$ cm$^{-3}$, $2 \times 10^{17}$ cm$^{-3}$, $1 \times 10^{17}$ cm$^{-3}$, $1 \times 10^{16}$ cm$^{-3}$, and $1 \times 10^{16}$ cm$^{-3}$, respectively, as quantified by calibrated secondary ion mass spectrometry (SIMS), glow discharge mass spectrometry (GDMS), interstitial gas analysis (IGA), or the like.

Referring again to FIG. 1B, the process of depositing a release layer 107 and a high quality epitaxial layer 109 may be repeated at least one, at least two, at least four, at least eight, or at least sixteen times. In certain embodiments the high quality epitaxial layers comprise GaN and the release layers comprise lattice-matched $Al_{0.83}In_{0.17}N$. In certain embodiments the roles are reversed, and the release layers comprise GaN and the high quality epitaxial layers comprise lattice-matched $Al_{0.83}In_{0.17}N$. The outermost surface 111 of the one or more high quality epitaxial layers has the same crystallographic orientation as surface 105.

Figure 1C:
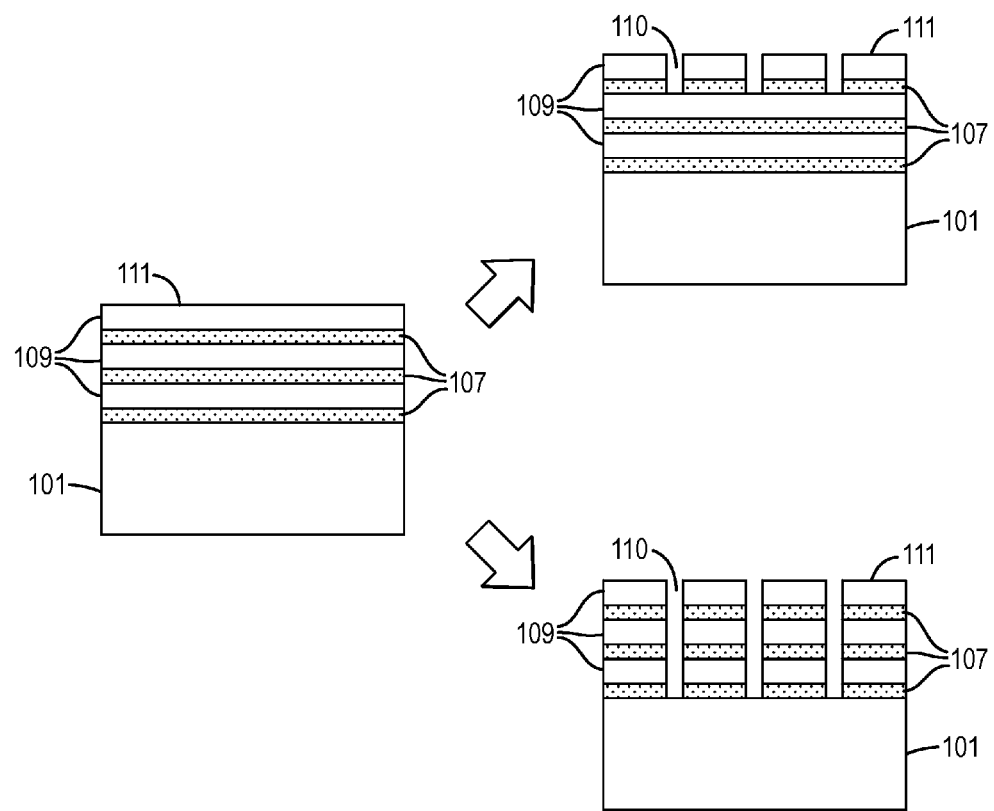

Referring to FIG. 1C, in some embodiments a series of channels 110 are provided through surface 111 of a high quality epitaxial layer 109 and a release layer 107 overlying nitride crystal 101. A pattern, for example, a series of stripes, may be defined by conventional photolithography. Channels 110 may be etched by reactive ion etching (RIE), inductively-coupled plasma (ICP) etching, ion bombardment, or the like. In some embodiments the channels 110 are etched through only a single high quality epitaxial layer. A channel may or may not cut through the outermost release layer, but a release layer is exposed in each channel. In other embodiments the channels are cut through two or more high quality epitaxial layers. The spacing between adjacent channels may be, for example, between about 10 microns and about 10 millimeters, or between about 0.1 millimeter and 1 millimeter.

Figure 1D:
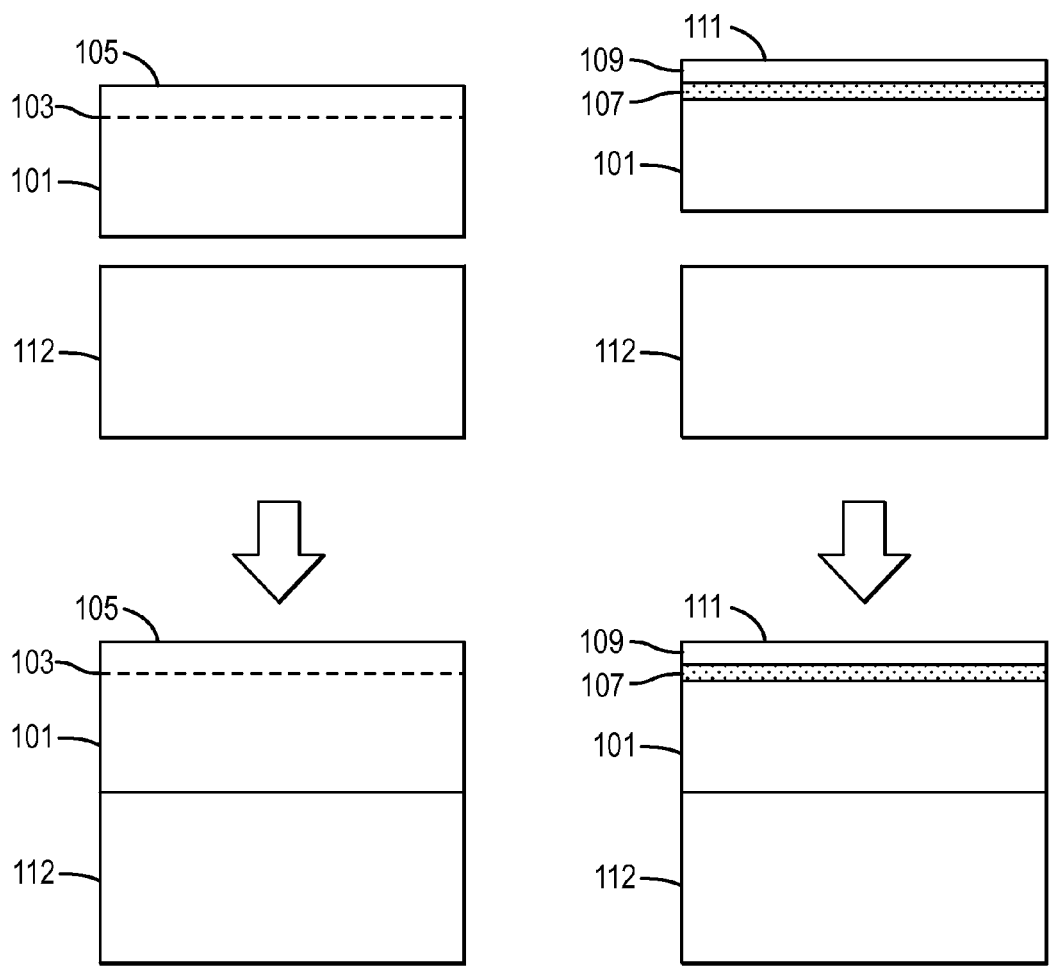

Referring to FIG. 1D, in some embodiments, nitride crystal 101 is affixed to block 112. Block 112 may comprise stainless steel, steel, an iron-based alloy, a nickel-based alloy, a cobalt-based alloy, a copper-based alloy, or the like. Block 112 may have edges that are machined or accurately ground. For example, at least two parallel faces on block 112 may be parallel to within 1 degree, within 0.5 degree, within 0.2 degree, within 0.1 degree, within 0.05 degree, within 0.02 degree, or to within 0.01 degree. At least two perpendicular faces on block 112 may be perpendicular to within 1 degree, within 0.5 degree, within 0.2 degree, within 0.1 degree, within 0.05 degree, within 0.02 degree, or to within 0.01 degree. Nitride crystal 101 may be affixed to block 112 by means of a cement, an epoxy, an adhesive, an Au—Sn eutectic, a solder bond, a braze joint, a polymer-based cement, or the like. One or more edges of nitride crystal 101 may also be accurately ground. At least one edge of nitride crystal 101 may be co-planar with an edge of block 112. In some embodiments, at least two edges of crystal 101 are co-planar with edges of block 112. In certain embodiments, nitride crystal 101 with implanted/damaged region 103 and overlying crystal surface 105 are affixed to block 112. In certain embodiments, nitride crystal 101, having release layer 107 and overlying high quality epitaxial layer 109 with crystal surface 111 are affixed to block 112.

Figure 1E:
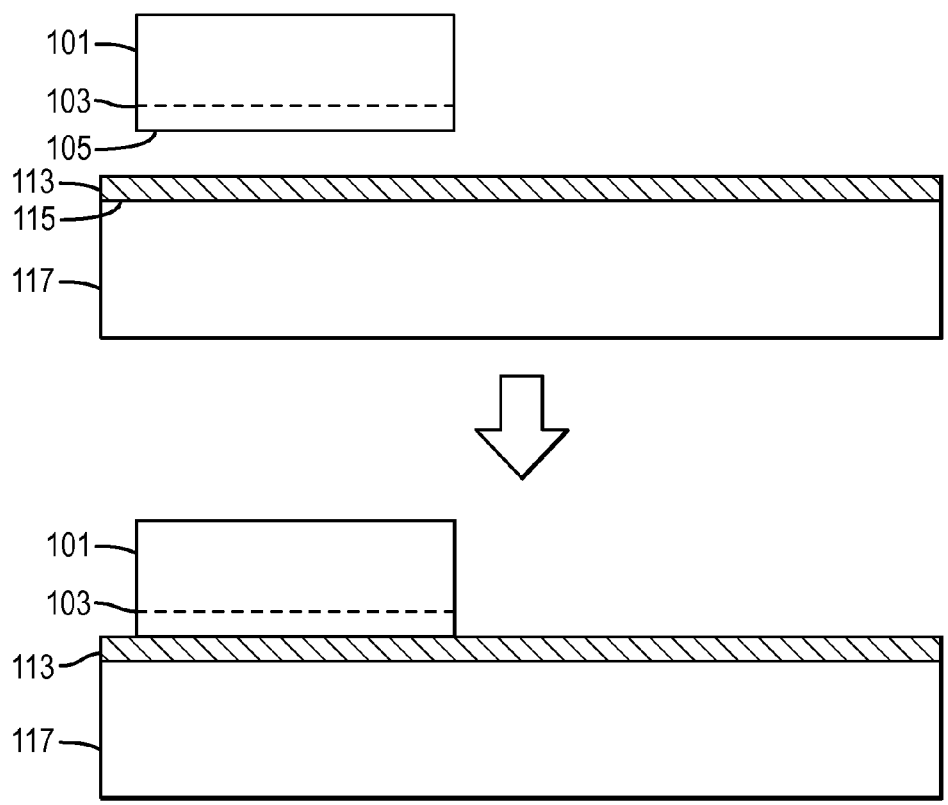
Figure 1F:
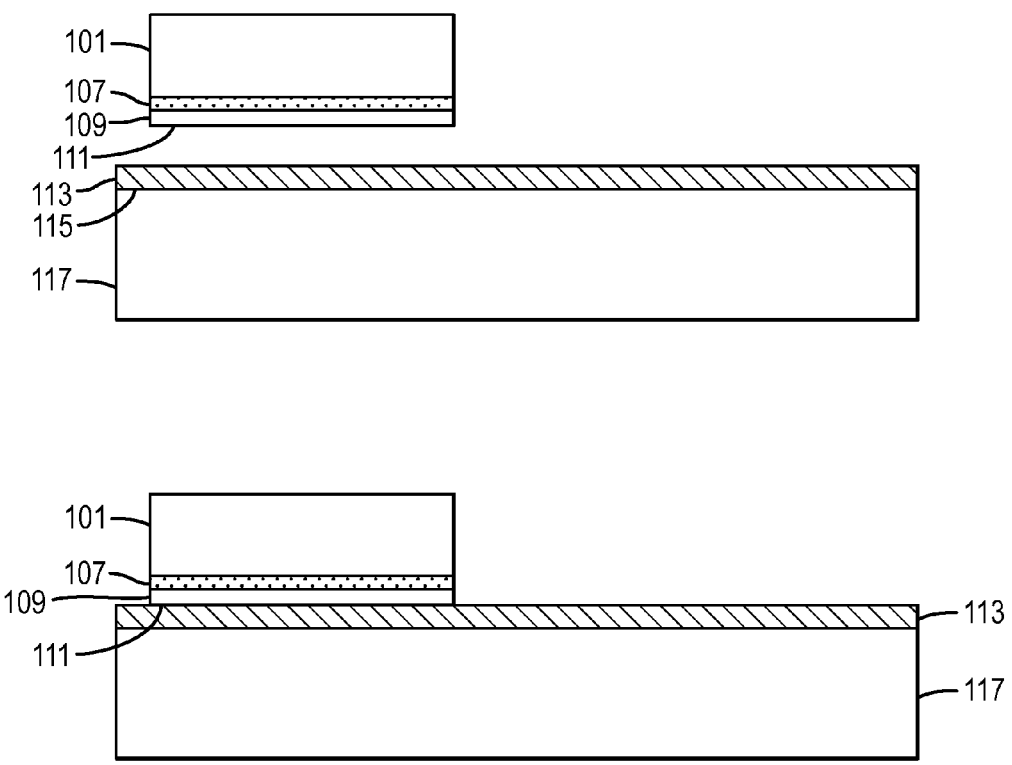

Referring to FIGS. 1E and 1F, a handle substrate 117 having a surface 115 is provided. Handle substrate 117 may comprise a single crystal, a polycrystalline material, or an amorphous material. Handle substrate 117 may comprise, for example, sapphire, aluminum oxide, mullite, silicon, silicon nitride, germanium, gallium arsenide, silicon carbide, MgAl$_2$O$_4$ spinel, zinc oxide, indium phosphide, gallium nitride, indium nitride, gallium aluminum indium nitride, or aluminum nitride. Handle substrate 117 may comprise substantially the same composition as crystal 101. In one specific embodiment, handle substrate 117 comprises crystals that have been merged or tiled together using methods other than those provided by the present disclosure. For example, handle substrate 117 may be formed using at least one of the tiling methods disclosed by Dwilinski et al., U.S. Patent Application Publication No. 2008/0156254 or the method disclosed in U.S. patent application Ser. No. 12/635,645, filed on Dec. 10, 2009, which is incorporated by reference in its entirety. In a particular embodiment, handle substrate 117 comprises substantially the same composition as crystal 101 and has a crystallographic orientation within about 10 degrees, within about 5 degrees, within about 2 degrees, or within about 1 degree of that of crystal 101. Handle substrate 117 may comprise a glass. Handle substrate 117 may comprise an oxide, nitride, or oxynitride of at least one of Si, Ge, Sn, Pb, B, Al, Ga, In, Tl, P, As, Sb, Pb, Li, Na, K, Rb, Cs, Mg, Ca, Sr, Ba, Y, Ti, Zr, Hf, Mn, Zn, and Cd. In one specific embodiment, handle substrate 117 comprises borophosphosilicate glass. Handle substrate 117 may be characterized by a thermal expansion coefficient parallel to surface 115 between room temperature and about 700 degrees Celsius that is between about $2.5 \times 10^{-6}$ K$^{-1}$ and about $7 \times 10^{-6}$ K$^{-1}$. Handle substrate 117 may have a thermal expansion coefficient parallel to surface 115 between room temperature and about 700 degrees Celsius that is between about $5.5 \times 10^{-6}$ K$^{-1}$ and about $6.5 \times 10^{-6}$ K$^{-1}$. Handle substrate 117 may have a softening point, that is, where the viscosity has a value of about $10^8$ Poise, at a temperature between about 500 degrees Celsius and about 1400 degrees Celsius. Handle substrate 117 may have a glass transition temperature between about 600 degrees Celsius and about 1200 degrees Celsius. Handle substrate 117 may have a softening point, that is, where its viscosity is characterized by a value of about $10^8$ Poise, at a temperature between about 600 degrees Celsius and about 900 degrees Celsius. Handle substrate surface 115 may be optically flat, with a deviation from flatness less than 1 micron, less than 0.5 micron, less than 0.2 micron, less than 0.1 micron, or less than 0.05 micron. Handle substrate surface 115 may be smooth, with a root-mean-square roughness less than 5 nanometers, less than 2 nanometers, less than 1 nanometer, less than 0.5 nanometer, less than 0.2 nanometer, less than 0.1 nanometer, or less than 0.05 nanometer, measured over an area of at least 10 microns×10 microns.

An adhesion layer 113 may be deposited on surface 115 of handle substrate 117. Adhesion layer 113 may comprise at least one of SiO$_2$, GeO$_2$, SiN$_x$, AlN$_x$, or B, Al, Si, P, Zn, Ga, Si, Ge, Au, Ag, Ni, Ti, Cr, Zn, Cd, In, Sn, Sb, Tl, W, In, Cu, or Pb, or an oxide, nitride, or oxynitride thereof. Adhesion layer 113 may further comprise hydrogen. The adhesion layer 113 may be deposited by thermal evaporation, electron-beam evaporation, sputtering, chemical vapor deposition, plasma-enhanced chemical vapor deposition, electroplating, or the like, or by thermal oxidation of a deposited metallic film. The thickness of adhesion layer 113 may, for example, between about 1 nanometer and about 10 microns, or between about 10 nanometers and about 1 micron. Adhesion layer 113 may comprise a non-homogenous composition. In some embodiments, adhesion layer 113 comprises a stack of thin films of varying compositions or a film of graded or continuously-varying composition. In some embodiments, adhesion layer 113 or at least one thin film contained within adhesion layer 113 is laterally nonuniform. In some embodiments, adhesion layer 113 or at least one thin film contained within comprises an array of dots, squares, rectangle, lines, a grid pattern, or the like. The composition of adhesion layer 113 may be chosen so as to undergo nascent melting at a temperature below about 300 degrees Celsius, below about 400 degrees Celsius, or below about 500 degrees Celsius. The composition of adhesion layer 113 may be chosen so as to have a melting point above about 600 degrees Celsius, above about 700 degrees Celsius, above about 800 degrees Celsius, or above about 900 degrees Celsius. The composition and structure of adhesion layer 113 may be chosen so as to undergo nascent melting at a temperature below about 300 degrees Celsius, below about 400 degrees Celsius, below about 500 degrees Celsius, or below about 600 degrees Celsius, then, following a thermal treatment at a temperature below the solidus temperature, to remain unmelted, or with a volume fraction of melt below about 20%, below about 10%, or below about 5%, at a temperature above about 600 degrees Celsius, above about 700 degrees Celsius, above about 800 degrees Celsius, or above about 900 degrees Celsius. In some embodiments, an adhesion layer is deposited on surface 105 of nitride crystal 101 or on surface 111 of high quality epitaxial layer 109 (not shown). The adhesion layer(s) may be annealed, for example, to a temperature between about 300 degrees Celsius and about 1,000 degrees Celsius. In some embodiments, an adhesion layer is deposited on surface 105 of crystal 101 and annealed prior to forming an implanted/damaged layer by ion implantation. In some embodiments, at least one adhesion layer is chemical-mechanically polished. In a particular embodiment, the root-mean-square surface roughness of at least one adhesion layer may be below about 0.5 nanometer, or below about 0.3 nanometer over a 20×20 µm² area. As shown in FIG. 1E, nitride crystal 101 having surface 105 and implanted/damaged region 103 may be affixed to adhesion layer 113 overlying handle substrate 117.

Referring to FIGS. 1E and 1F, surface 105 or 111 of nitride crystal 101, surface 111 of high quality epitaxial layer 109 overlying release layer 107, or an adhesion layer placed thereupon, may be placed in contact with adhesion layer 113 and/or with the surface 115 of the handle substrate 117 and bonded. In one specific embodiment, the bonding comprises wafer bonding. In another specific embodiment, the bonding comprises a eutectic die attach or die bonding operation. In a particular embodiment, the bonding operation is performed in a clean room, with less than 10,000, less than 1,000, less than 100, or less than 10 particles per cubic centimeter in the air. Particles may be removed from at least one of the surfaces immediately prior to bonding by spraying, brushing, or rinsing with ionized nitrogen, a $CO_2$ jet, $CO_2$ snow, high-resistivity water, an organic solvent, such as methanol, ethanol, isopropanol, acetone, or the like. In some embodiments, surface 111 of high quality epitaxial layer 109, or the surface of an adhesion layer placed thereupon, and corresponding surfaces are brought into contact while immersed in a liquid. Optionally, at least one of the surfaces is exposed to a plasma to enhance bonding.

The positional and orientational accuracy of the placement of nitride crystal 101 with respect to handle substrate 117 may be precisely controlled. In one specific embodiment, nitride crystal is placed on handle substrate 117 by a pick and place machine, or robot, or a die attach tool. Nitride crystal 101 may be picked up by a vacuum chuck, translated to the desired position above handle substrate 117 by a stepper-motor-driven x-y stage, re-oriented, if necessary, by a digital-camera-driven rotational drive, and lowered onto the handle substrate. The positional accuracy of placement may be better than 50 microns, better than 30 microns, better than 20 microns, better than 10 microns, or better than 5 microns. The orientational accuracy of placement may be better than 5 degrees, better than 2 degrees, better than 1 degree, better than 0.5 degree, better than 0.2 degree, better than 0.1 degree, better than 0.05 degree, better than 0.02 degree, or better than 0.01 degree. In another specific embodiment, block 112, attached to nitride crystal 101, is placed in a kinematic mount. The kinematic mount establishes orientational accuracy with respect to handle substrate 117 that is better than 1 degree, better than 0.5 degree, better than 0.2 degree, better than 0.1 degree, better than 0.05 degree, better than 0.02 degree, or better than 0.01 degree. Nitride crystal 101, block 112, and the kinematic mount may then be positioned with respect to handle substrate 117 with submicron accuracy using an x-y stage similar to that in a stepper photolithography tool, using stepper motors in conjunction with voice coils. In some embodiments, the azimuthal crystallographic orientations of crystal 101 and handle substrate 117 are equivalent to within about 10 degrees, within about 5 degrees, within about 2 degrees, or within about 1 degree.

Nitride crystal 101 may be pressed against handle substrate 117 with a pressure between about 0.001 megapascals and about 100 megapascals. In some embodiments, van der Waals forces or capillarity associated with nascent melting of the adhesion layer(s) are sufficient to obtain a good bond and very little or no additional applied force is necessary. Nitride crystal 101 and handle substrate 117 may be heated to a temperature between about 30 degrees Celsius and about 950 degrees Celsius, between about 30 degrees Celsius and about 400 degrees Celsius, between about 30 degrees Celsius and about 200 degrees Celsius to strengthen the bond. In some embodiments, heating of nitride crystal 101 and handle substrate 117 is performed while they are placed in mechanical contact and/or mechanically loaded against one another.

In some embodiments, at least the surface region of bonded nitride crystal 101 having implanted/damaged region 103 and handle substrate 117 are heated to a temperature between about 200 degrees Celsius and about 800 degrees Celsius or between about 500 degrees Celsius and about 700 degrees Celsius to cause micro-bubbles, micro-cracks, micro-blisters, or other mechanical flaws within region 103. In one specific embodiment, surface 105 or high quality epitaxial layer 109 is heated by means of optical or infrared radiation through handle substrate 117, and the distal portion of crystal 101, which may be in contact with block 112 (not shown), may remain less than about 300 degrees Celsius, less than about 200 degrees Celsius, or less than about 100 degrees Celsius. In some embodiments, mechanical energy may be provided instead of or in addition to thermal energy. In some embodiments, an energy source such as a pressurized fluid is directed to a selected region, such as an edge, of bonded nitride crystal 101 to initiate a controlled cleaving action within region 103. After the application of energy, the distal portion of nitride crystal 101 is removed, leaving a proximate portion of nitride crystal 101 bonded to handle substrate 117. In some embodiments, distal portion of nitride crystal 101 remains bonded to block 112 (not shown). In some embodiments, the newly exposed surface of distal portion of nitride crystal 101 is polished, dry-etched, or chemical-mechanically polished. Care is taken to maintain the surface crystallographic orientation of the newly exposed surface of distal portion of nitride crystal 101 the same as the original orientation of surface 105. In some embodiments, an adhesion layer is deposited on the newly exposed surface of distal portion of crystal 101. In some embodiments, the adhesion layer is chemical-mechanically polished.

Figure 1G:
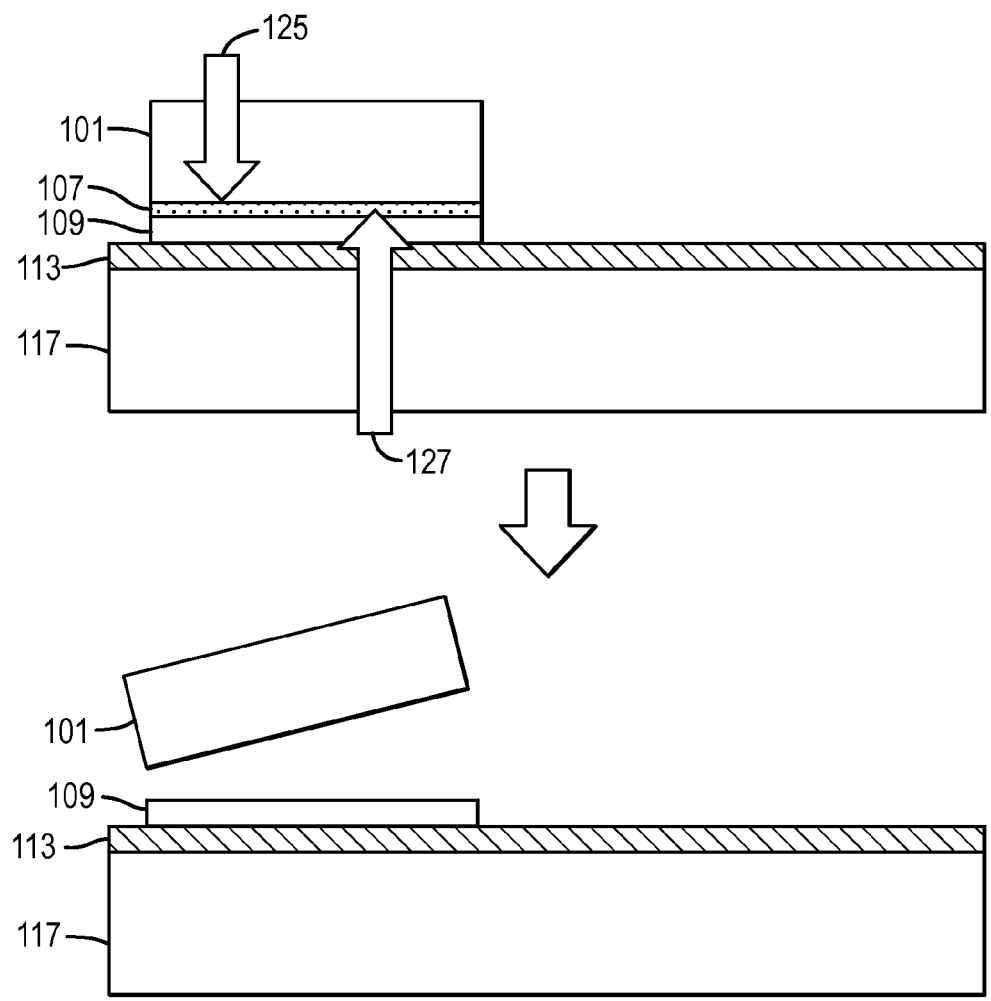

Referring to FIG. 1G, in some embodiments, nitride crystal 101 is separated from high quality epitaxial layer 109 and handle substrate 117 by laser irradiation. The release layer 107 may be illuminated through nitride crystal 101 by through-crystal laser radiation 125 having a wavelength at which the release layer has an optical absorption coefficient greater than 1,000 $cm^{-1}$ and the nitride crystal is substantially transparent, with an optical absorption coefficient less than 50 $cm^{-1}$. In another set of embodiments, the release layer is illuminated through handle substrate 117 and adhesion layer 113 by through-handle laser radiation 127 having a wavelength at which the release layer has an optical absorption coefficient greater than 1,000 $cm^{-1}$ and the handle substrate is substantially transparent, with an optical absorption coefficient less than 50 $cm^{-1}$. Absorption of the laser energy by the release layer 107 occurs on a very short length scale, causing considerable local heating. Such local heating causes partial or complete decomposition of the release layer and/or a thin portion of the nitride crystal in direct contact with the release layer, forming metal and $N_2$, which may occur as a thin layer or as micro- or nano-bubbles. Such methods are disclosed, for example, in U.S. Pat. No. 8,148,801. The thin layer or micro- or nano-bubbles of $N_2$ mechanically weakens the interface between the nitride crystal and the high quality epitaxial layer, enabling facile separation of the nitride crystal from the high quality epitaxial layer, which is in turn bonded to the handle substrate. The optimal degree of weakening of the interface, without causing undesired damage to the high quality epitaxial layer or the handle substrate, is achieved by adjusting the die temperature, the laser power, the laser spot size, the laser pulse duration, and/or the number of laser pulses. The laser fluence to effect separation may be between 300 and 900 millijoules per square centimeter or between about 400 $mJ/cm^2$ and about 750 $mJ/cm^2$. The uniformity of the laser beam may be improved by inclusion of a beam homogenizer in the beam path, and the beam size may be about 4 mm by 4 mm. In some embodiments, the laser beam is scanned or rastered across the release layer rather than being held stationary. Separation may be performed at a temperature above the melting point of the metal produced by decomposition, e.g., above about 30 degrees Celsius in the case of gallium metal.

In some embodiments, multiple release layers and high quality epitaxial layers are present in the wafer-bonded stack. In this case laser illumination is preferably applied through the handle substrate, and the fluence controlled so that substantial decomposition takes place only within the release layer closest to the handle substrate and the remaining release layers and high quality epitaxial layers remain bonded to the nitride crystal after liftoff.

After separation of the high quality epitaxial layer from the nitride crystal, any residual gallium, indium, or other metal or nitride on the newly exposed back surface of the high quality epitaxial layer, on nitride crystal 101, or on another newly-exposed high quality epitaxial layer still bonded to nitride crystal 101 may be removed by treatment with at least one of hydrogen peroxide, an alkali hydroxide, tetramethylammonium hydroxide, an ammonium salt of a rare-earth nitrate, perchloric acid, sulfuric acid, nitric acid, acetic acid, hydrochloric acid, and hydrofluoric acid. The surfaces may be further cleaned or damage removed by dry-etching in at least one of Ar, $Cl_2$, and $BCl_3$, by techniques such as chemically-assisted ion beam etching (CAIBE), inductively coupled plasma (ICP) etching, or reactive ion etching (RIE). The surfaces may be further treated by chemical mechanical polishing.

In some embodiments, traces of the release layer may remain after laser liftoff or etching from the edges of the release layer. Residual release layer material may be removed by photoelectrochemical etching, illuminating the back side of the high quality epitaxial layer or the front side of nitride crystal 101 or of the front side of the outermost high quality epitaxial layer still bonded to nitride crystal 101 with radiation at a wavelength at which the release layer has an optical absorption coefficient greater than 1,000 $cm^{-1}$ and the high quality epitaxial layer is substantially transparent, with an optical absorption coefficient less than 50 $cm^{-1}$.

Figure 1H:
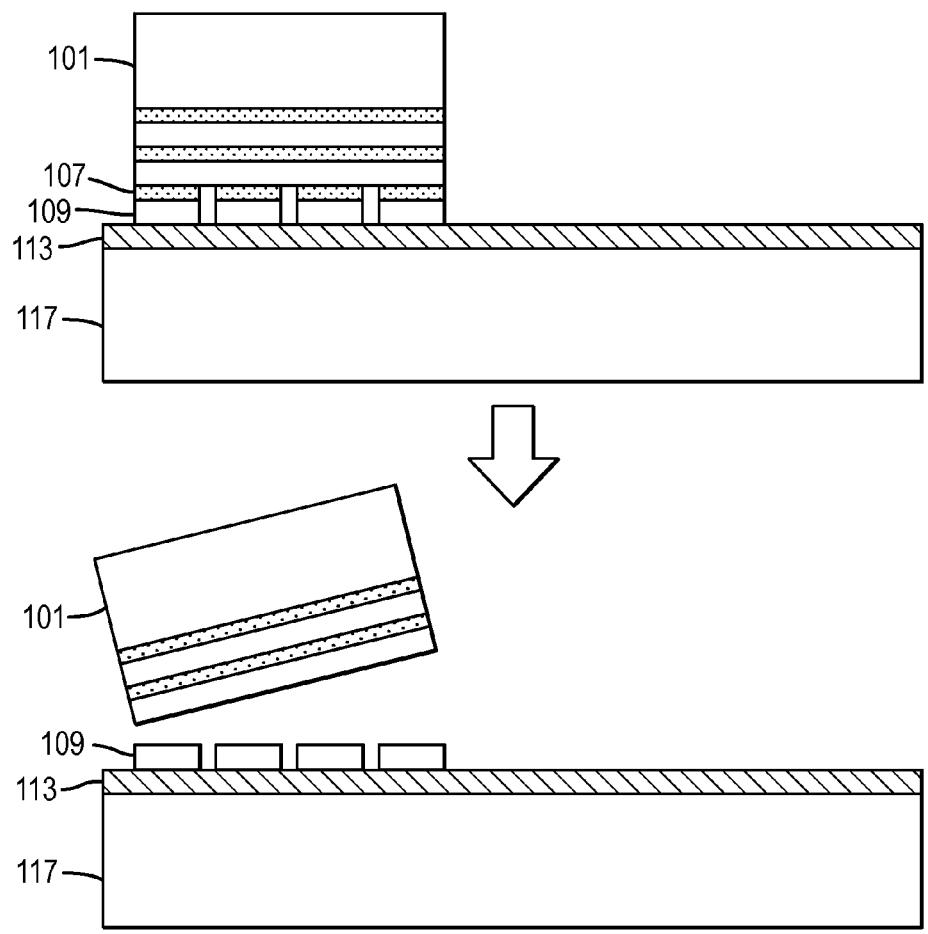

Referring to FIG. 1H, in another set of embodiments, the high quality epitaxial layer bonded to the handle substrate is separated from the nitride crystal by means of chemical etching of the release layer. FIG. 1H shows nitride crystal 101 having alternate release layers 107 and high quality epitaxial layers 109 bonded to adhesion layer 113 overlying handle substrate 117. Nitride crystal 101 and one or more of release layers 107 and/or high quality epitaxial layers 109 can be removed from a high quality epitaxial layer 109 bonded to adhesion layer 113 overlying handle substrate 117. In one embodiment, one or more edges of the release layer is treated with at least one of 1,2-diaminoethane, hydrogen peroxide, an alkali hydroxide, tetramethylammonium hydroxide, an ammonium salt of a rare-earth nitrate, perchloric acid, sulfuric acid, nitric acid, acetic acid, hydrochloric acid, and hydrofluoric acid. In one specific embodiment, the edge of the release layer is etched by treatment in a mixture of 200 milliliters of deionized water, 50 grams of diammonium cerium nitrate, $Ce(NH_4)_2(NO_3)_6$, and 13 milliliters of perchloric acid, $HClO_4$, at approximately 70 degrees Celsius. At least one edge of the release layer is etched away, mechanically weakening the interface between the nitride base crystal and the high quality epitaxial layer and enabling facile separation of the nitride base crystal from the high quality epitaxial layer, which is in turn bonded to at least one semiconductor device layer. The right degree of weakening of the interface, without causing undesired damage to the high quality epitaxial layer or the semiconductor structure, is achieved by adjusting the temperature and time of the chemical treatment. The time required for lateral etching of the release layer may be reduced by incorporating a pre-formed set of channels in the release layer. In the case that multiple, alternating release layers and high quality epitaxial layers are bonded to nitride crystal 101, transfer may be restricted to the outermost high quality epitaxial layer by utilizing etch channels that penetrate only the outermost high quality epitaxial layer.

In still another set of embodiments, the high quality epitaxial layer bonded to the handle substrate is separated from the nitride crystal by means of photoelectrochemical (PEC) etching of the release layer. For example, an InGaN layer or InGaN/InGaN superlattice may be deposited as the release layer. An electrical contact may be placed on the nitride crystal and the release layer illuminated with above-bandgap radiation, for example, by means of a Xe lamp and a filter to remove light with energy greater than the bandgap of the high quality epitaxial layer and/or the nitride crystal.

Figure 1I:
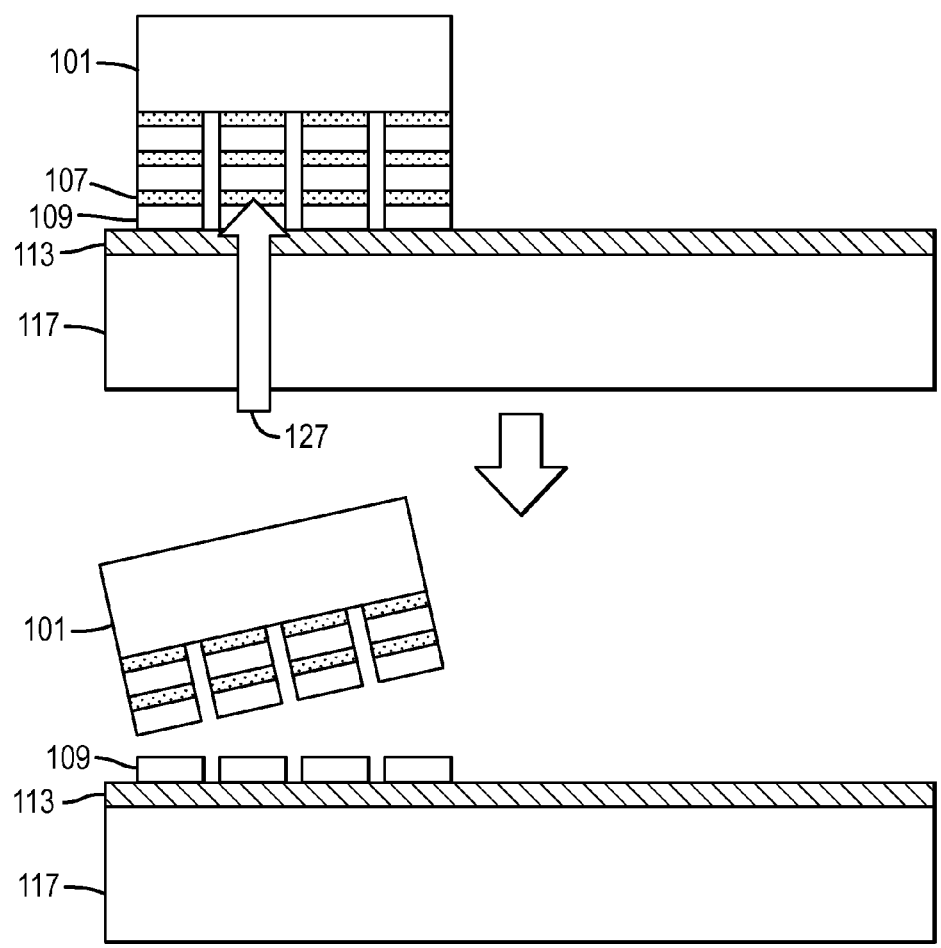

In one set of embodiments, illustrated schematically in FIG. 1I, the laser radiation 127 is provided through the handle substrate 117 and adhesion layer 113 and the intensity adjusted so that essentially all the light is absorbed by the release layer in closest proximity to the handle substrate.

At least one edge of a release layer 107 is exposed to an electrolyte, for example, a stirred, 0.004M HCl solution. The time required for lateral etching of the release layer 107 may be reduced by incorporating a pre-formed set of channels in the release layer. In the case that multiple, alternating release layers and high quality epitaxial layers 109 are bonded to nitride crystal 101, transfer may be restricted to the outermost high quality epitaxial layer even when the etch channels penetrate multiple high quality epitaxial layers by ensuring that the light is fully absorbed by only the outermost release layer. In one set of embodiments, GaN is deposited as the release layer and lattice-matched AlInN comprises the high quality epitaxial layer, and the wavelength range of the illumination is chosen so that electron-hole pairs are generated in the GaN but not in the AlInN.

In yet another set of embodiments, the high quality epitaxial layer bonded to the handle substrate is separated from the nitride crystal by means of selective oxidation followed by chemical etching of the release layer. For example, at least one release layer comprising $Al_xIn_yGa_{1-x-y}N$, where $0<x$, $x+y\leq 1$, $0\leq y\leq 1$, or $Al_{0.83}In_{0.17}N$, lattice matched to GaN, may be selectively oxidized. The selective oxidation may be performed by exposing at least one edge of the Al-containing release layer to a solution comprising nitriloacetic acid (NTA) and potassium hydroxide at a pH of approximately 8 to 11 and an anodic current of approximately 20 $\mu A/cm^2$, to about 0.1 $kA/cm^2$. The oxide layer may then be removed by treatment in a nitric acid solution at approximately 100 degrees Celsius. The time required for lateral etching of the release layer may be reduced by incorporating a pre-formed set of channels in the release layer. In the case that multiple, alternating release layers and high quality epitaxial layers are bonded to nitride crystal 101, transfer may be restricted to the outermost high quality epitaxial layer by utilizing etch channels that penetrate only the outermost high quality epitaxial layer.

Figure 1J:
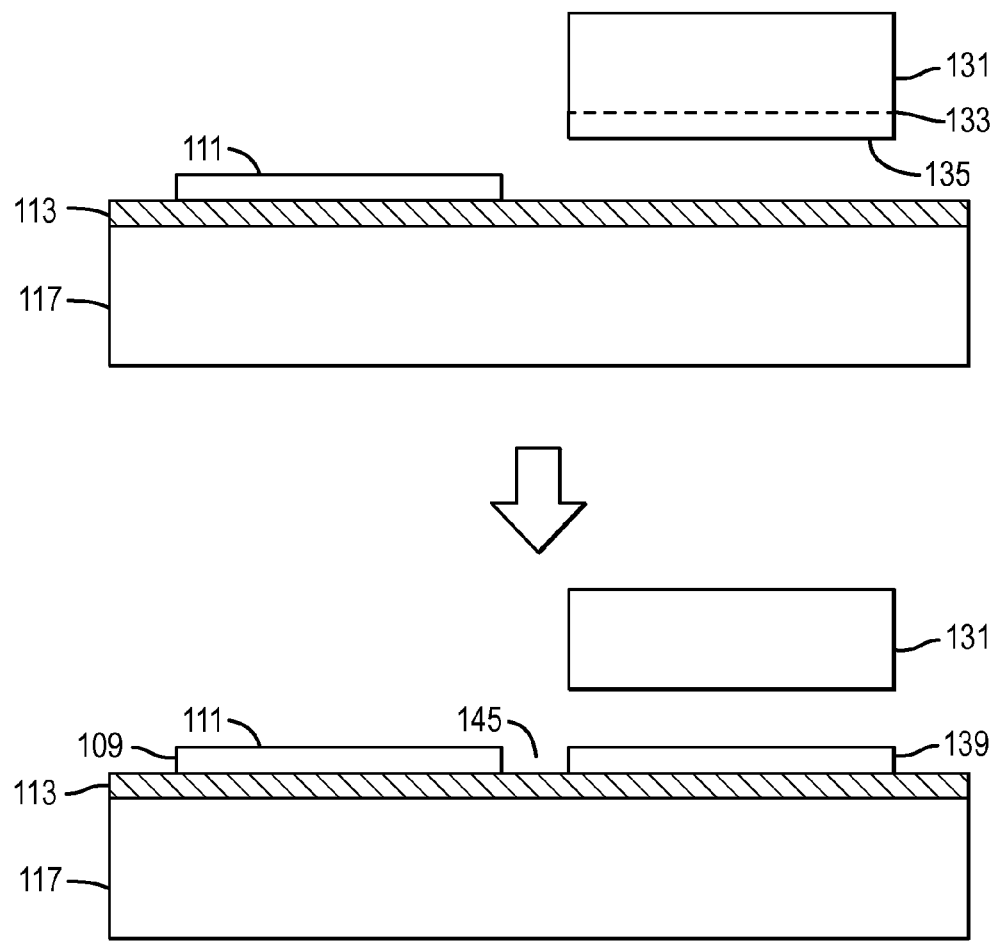
Figure 1K:
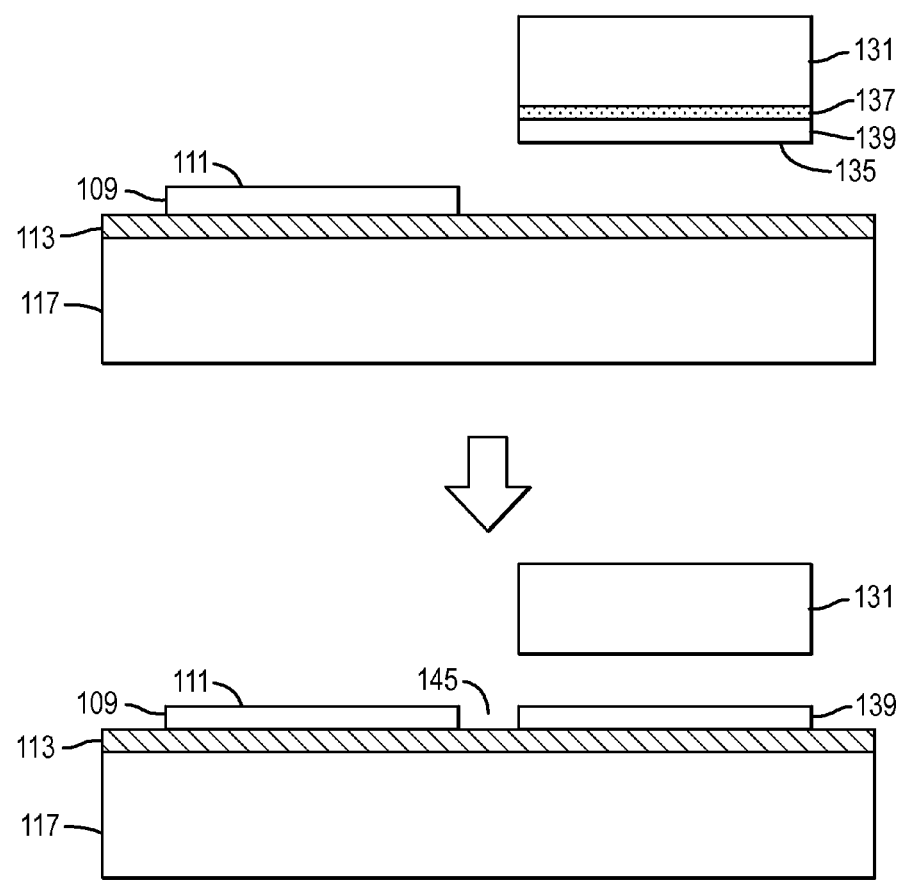

Referring to FIGS. 1J and 1K, the bonding process is repeated. A second nitride crystal 131 having surface 135, or the distal portion of the first nitride crystal (not shown), is bonded in close proximity to the first nitride crystal 109 or to the proximate portion of first nitride crystal. The second nitride crystal 131 may have an ion-implanted, damaged region 133 or at least one release layer 137 and at least one high quality epitaxial layer 139, similar to the first nitride crystal. The second nitride crystal or the outer most high quality epitaxial layer on the second nitride crystal has a surface 135 wherein the crystallographic orientation is essentially identical to that of surface 105 of the nitride crystals 101 or to that of surface 111 of the first high quality epitaxial layer. In some embodiments, accurate equality between the surface orientation of the first and second nitride crystals is achieved by growing each crystal to an accurately flat on-axis orientation, for example, (0 0 0 1) Ga-polar, (0 0 0 -1) N-polar, {1 0 -1 0} non-polar, or {1 0 -1 ±1} semi-polar. If the first and/or second nitride crystals are polished, dry-etched, or chemical-mechanically polished, care is taken so as not to significantly alter the surface orientation of either. In some embodiments, accurate equality between the surface orientation of the first and second nitride crystals is achieved by removing a uniform, thin proximate portion of the first nitride crystal to form the second nitride crystal. If the distal portion of the first nitride crystal, used also as the second nitride crystal, is polished, dry-etched, or chemical-mechanically polished, care is taken so as not to significantly alter the surface orientation. In other embodiments, accurate equality between the surface orientation of the first and second nitride crystals is achieved by removing a uniform, thin high quality epitaxial layer from the first nitride crystal to form the second nitride crystal. If the distal portion of the first nitride crystal, used also as the second nitride crystal, is polished, dry-etched, or chemical-mechanically polished, care is taken so as not to significantly alter the surface orientation. For example, the crystallographic orientations of first surfaces 105 or 111 and 135, respectively, of the outermost surface or high quality epitaxial layers on the first and second nitride crystals may be identical to less than 0.5 degree, less than 0.2 degree, less than 0.1 degree, less than 0.05 degree, less than 0.02 degree, or less than 0.01 degree. In still other embodiments, accurate equality between the surface orientation of the first and second nitride crystals is achieved by very careful crystallographic orientation and grinding and/or polishing, for example, using a high-precision goniometer. After bonding, a distal portion of the second nitride crystal may be removed. Gap 145 between the edges of two or more adjacent nitride crystals or proximate portions thereof may be less than 1 millimeter, less than 100 microns, less than 50 microns, less than 20 microns, less than 10 microns, less than 5 microns, less than 2 microns, or less than 1 micron. The bonding process may be repeated more than two, more than 4, more than 8, more than 16, more than 32, or more than 64 times.

Figure 2:
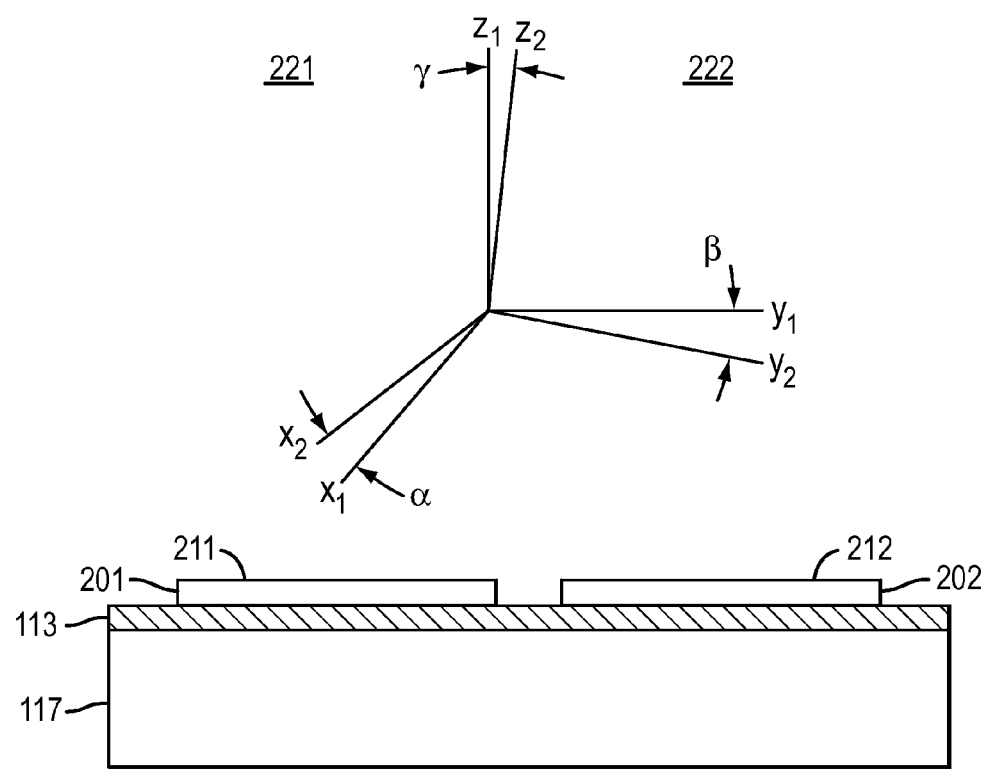
FIG. 2 is a diagram illustrating the crystallographic misorientation between two adjacent wafer-bonded crystals.
Figure 3A:
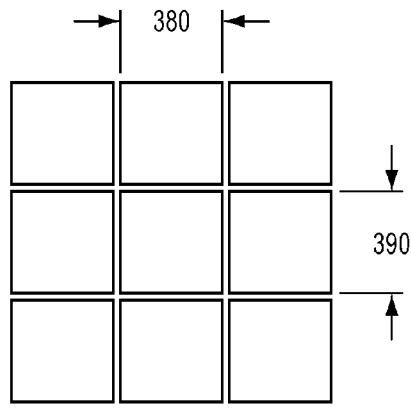
FIGS. 3A, 3B, 3C, and 3D are diagrams illustrating arrangements of tiled crystals.
Figure 3B:
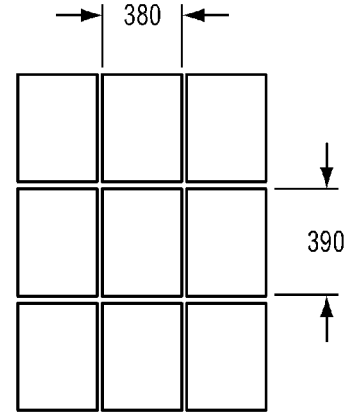
Figure 3C:
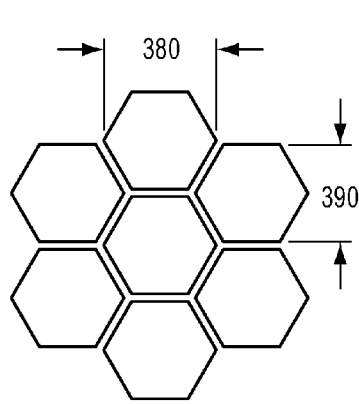
Figure 3D:
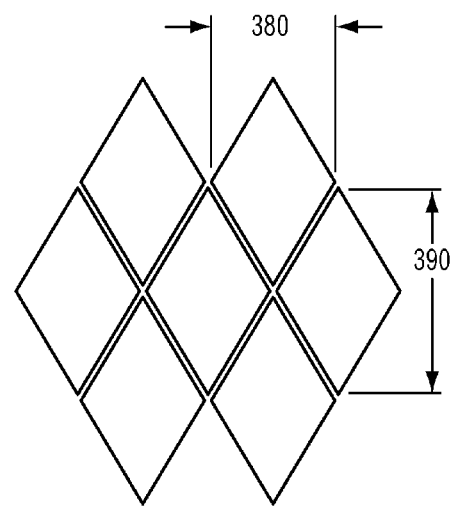

The placement of the second nitride crystal is performed in such a way that the crystallographic orientations between the from the first nitride crystal and the second nitride crystal, or the high quality epitaxial layers thereupon, are very nearly identical. Referring to FIG. 2, first coordinate system 221 ($x_1$ $y_1$ $z_1$) represents the crystallographic orientation of the first nitride crystal or of the proximate portion of the high quality epitaxial layer of the first nitride crystal 201, where $z_1$ is the negative surface normal of the nominal orientation of the surface 211 of first nitride crystal 20, and $x_1$ and $y_1$ are vectors that are orthogonal to $z_1$. For example, if surface 211 has a (0 0 0 1) orientation, then $z_1$ is a unit vector along [0 0 0 -1], and $x_1$ and $y_1$ may be chosen to be along [1 0 -1 0] and [1 -2 1 0], respectively. If surface 211 has a (1 0 -1 0) orientation, then $z_1$ is a unit vector along [-1 0 1 0] and $x_1$ and $y_1$ may be chosen to be along [1 -2 1 0] and [0 0 0 1], respectively. Similarly, second coordinate system 222 ($x_2$ $y_2$ $z_2$) represents the crystallographic orientation of the second nitride crystal or of the proximate portion of the high quality epitaxial layer from the second nitride crystal 202, where $z_2$ is the negative surface normal of the nominal orientation of surface 212 of second nitride crystal 202 and $x_2$ and $y_2$ are vectors that are orthogonal to $z_2$, where the same convention is used for the crystallographic directions corresponding to ($x_2$ $y_2$ $z_2$) as for ($x_1$ $y_1$ $z_1$). The crystallographic misorientation between the surface of first nitride crystal and the surface of second nitride crystal may be specified by the three angles $\alpha$, $\beta$, and $\gamma$, where $\alpha$ is the angle between $x_1$ and $x_2$, 13 is the angle between $y_1$ and $y_2$, and $\gamma$ is the angle between $z_1$ and $z_2$. Because the surface orientations of the first and second nitride crystals are nearly identical, the polar misorientation angle $\gamma$ is very small, for example, less than 0.5 degree, less than 0.2 degree, less than 0.1 degree, less than 0.05 degree, less than 0.02 degree, or less than 0.01 degree. Because of the precise control in the orientation of the nitride crystal during placement, the misorientation angles $\alpha$ and $\beta$ are also very small, for example, less than 1 degree, less than 0.5 degree, less than 0.2 degree, less than 0.1 degree, less than 0.05 degree, less than 0.02 degree, or less than 0.01 degree. Typically, $\gamma$ will be less than or equal to $\alpha$ and $\beta$. The crystallographic misorientation between additional, adjacent nitride crystals is similarly very small. However, the crystallographic misorientation angles α, β, and γ may be detectable by x-ray measurements and may be greater than about 0.005 degree, greater than about 0.02 degree, greater than about 0.05 degree, greater than about 0.1 degree, greater than 0.3 degree, or greater than 0.5 degree.

Referring to FIGS. 3A-3D, after placing and bonding a number of similarly-sized and similarly-shaped crystals, portions thereof, or high quality epitaxial layers from one or more nitride crystals, a tiled arrangement of high quality epitaxial layers may be formed, with each adjacent pair on the handle substrate being accurately aligned crystallographically with its neighbor(s). The tiling pattern may be, for example, (a) square (FIG. 3A), (b) rectangular (FIG. 3B), (c) hexagonal (FIG. 3C), (d) rhombal (FIG. 3D), or (e) irregular (not shown). Other arrangements are also possible. The gaps between the edges of two or more adjacent high quality epitaxial layers may be less than 5 millimeters, less than 1 millimeter, less than 100 microns, less than 50 microns, less than 20 microns, less than 10 microns, less than 5 microns, less than 2 microns, or less than 1 micron. The crystals may have a first lateral dimension 380 and a second lateral dimension 390, the lateral dimensions defining a plane that is perpendicular to the thickness, where each of the first lateral dimension and the second lateral dimension may be at least about 0.5 millimeter, 1 millimeter, 2 millimeters, 4 millimeters, 5 millimeters, 10 millimeters, 15 millimeters, 20 millimeters, 25 millimeters, 35 millimeters, 50 millimeters, 75 millimeters, 100 millimeters, 150 millimeters, or can be at least about 200 millimeters.

In some embodiments, a similar set of nitride crystals or high quality epitaxial layers is wafer-bonded to the back surface of the handle substrate by an analogous procedure to that used to form the tile pattern of nitride crystals or high quality epitaxial layers on the front surface of the handle substrate. In a particular embodiment, the tile pattern on the back surface of the handle substrate is a mirror image of the tile pattern on the front surface of the handle substrate, with the front and back tile patterns in registry.

In one set of embodiments, the at least two nitride crystals or high quality epitaxial layers on the handle substrate are used as a substrate for fabrication of one or more devices.

The two or more tiled high quality epitaxial layers or crystals bonded to the handle substrate may be prepared for lateral growth for epitaxial growth and/or for fusion of the tiled crystals into a single larger crystal. The lateral crystal growth may be achieved by techniques such as molecular beam epitaxy (MBE), metalorganic chemical vapor deposition (MOCVD), hydride vapor phase epitaxy (HVPE), ammonothermal crystal growth, or crystal growth from a flux.

Figure 4A:
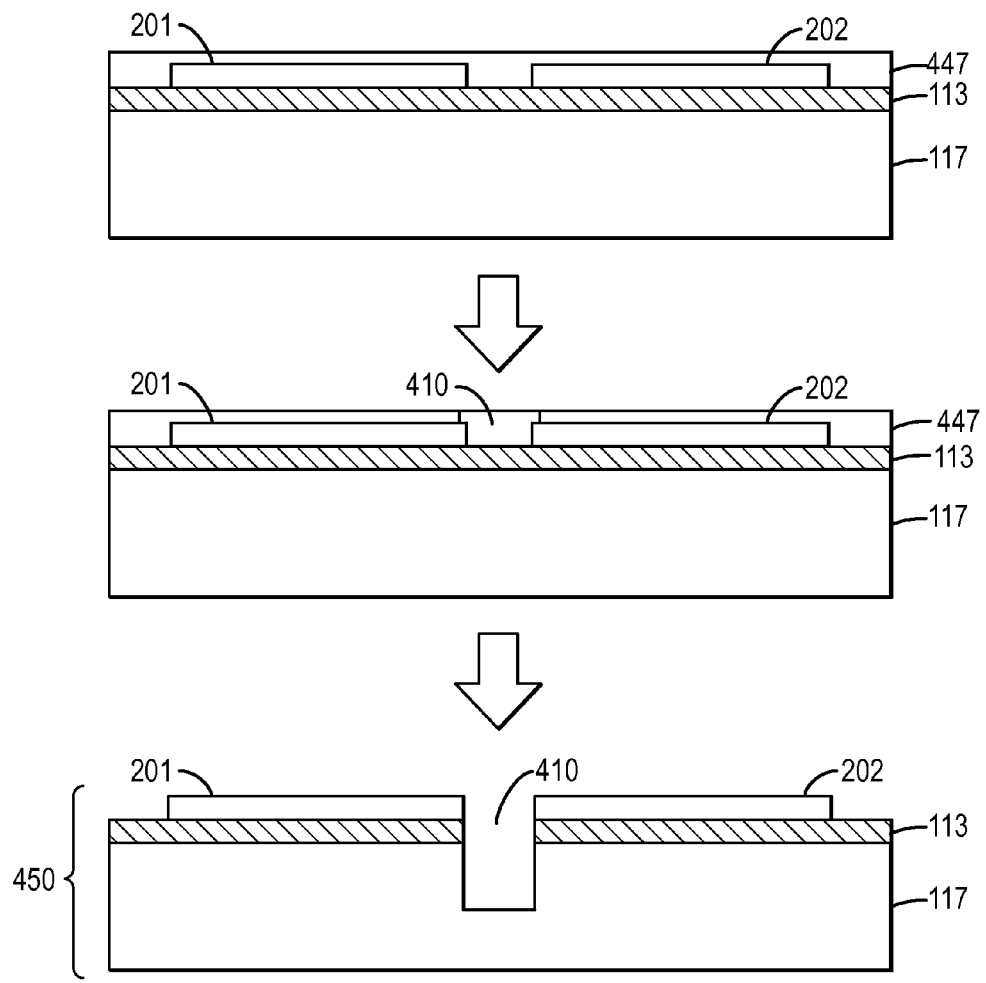
FIGS. 4A, 4B, 5, and 6 are diagrams illustrating a method for coalescing wafer-bonded crystals.
Figure 4B:
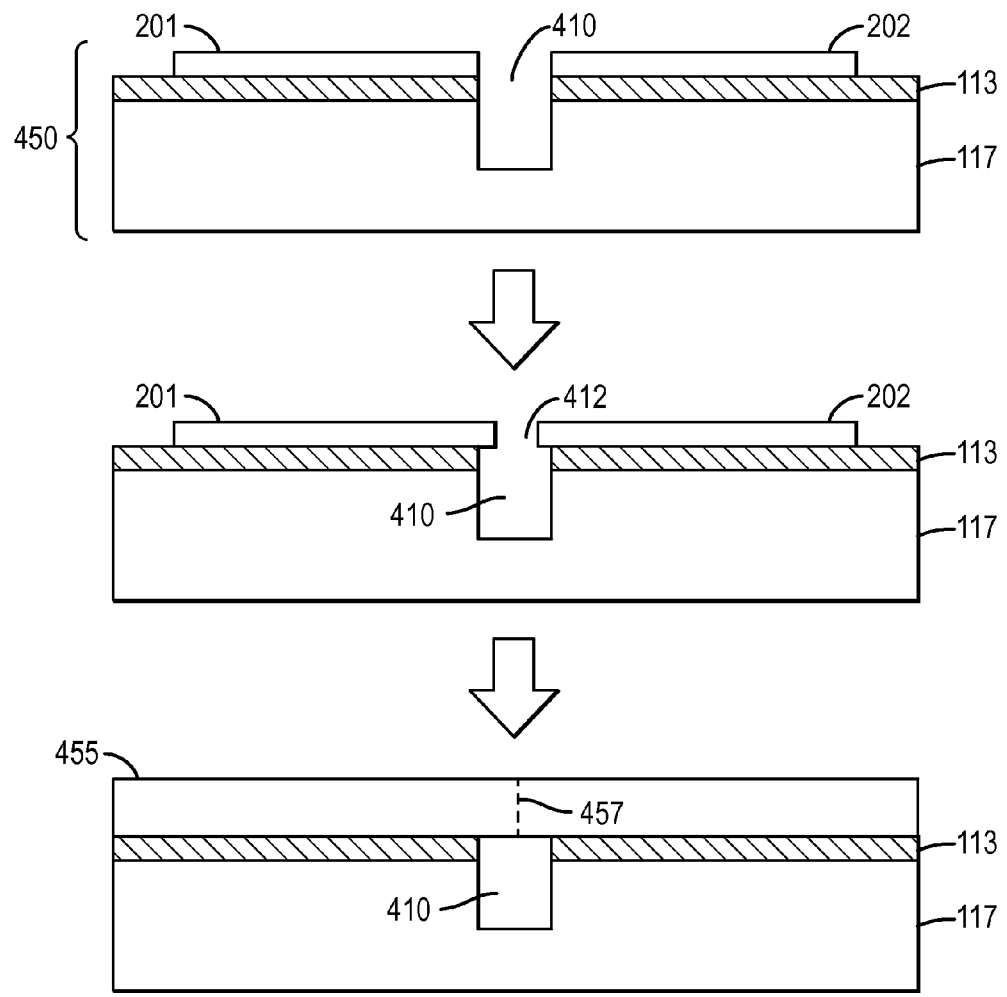

In some embodiments, the handle substrate is suitable for exposure to the epitaxial growth environment without further treatment. In some embodiments, a thermal treatment may be applied to increase the melting point of at least a portion of the adhesion layer(s). In some embodiments, growth may proceed more smoothly, with fewer stresses, if the gaps between adjacent nitride crystals are undercut. Referring to FIG. 4A, a photoresist 447 may be spun onto the bonded, tiled substrate comprising handle substrate 117, first nitride crystal 201, and second nitride crystal 202. Photoresist 447 may be exposed through a mask, etched, and an exposed channel 410 etched by dry etching, and the photoresist removed to form patterned nitride/handle substrate 450. In another embodiment, the gaps between the adjacent nitride crystals may be undercut or increased in depth by fast ion-beam etching, wire-sawing, sawing, or dicing. Referring to FIG. 4B, patterned nitride/handle substrate 450 may be used as a substrate for epitaxial nitride growth by MBE, MOCVD, HVPE, ammonothermal growth, or flux growth. FIG. 4B shows patterned nitride/handle substrate 450 comprising a first nitride crystal 201 and second nitride crystal 202 separated by channel 410 overlying adhesion layer 113 and handle substrate 117. Growth is performed as known in the art, and the at least two nitride crystals 201 and 202 grow both laterally and vertically to form a merged nitride crystal 455. Horizontal growth causes nitride crystal 201 and nitride crystal 202 to grow toward each other and separated by gap 412 over channel 410. Because of the very low crystallographic misorientation between nitride crystals 201 and 202, the coalescence front 457 may have a modest concentration of dislocations but a classical low angle grain boundary or tilt boundary may be difficult to detect. Threading dislocations, for example, edge dislocations, may be present at coalescence fronts 457, for example, with a line density that is less than about $1 \times 10^5$ $cm^{-1}$, less than about $3 \times 10^4$ $cm^{-1}$, less than about $1 \times 10^4$ $cm^{-1}$, less than about $3 \times 10^3$ $cm^{-1}$, less than about $1 \times 10^3$ $cm^{-1}$, less than about $3 \times 10^2$ $cm^{-1}$, or less than about $1 \times 10^2$ $cm^{-1}$. The density of dislocations along the coalescence fronts may be greater than 5 $cm^{-1}$, greater than 10 $cm^{-1}$, greater than 20 $cm^{-1}$, greater than 50 $cm^{-1}$, greater than 100 $cm^{-1}$, greater than 200 $cm^{-1}$, or greater than 500 $cm^{-1}$.

Figure 5:
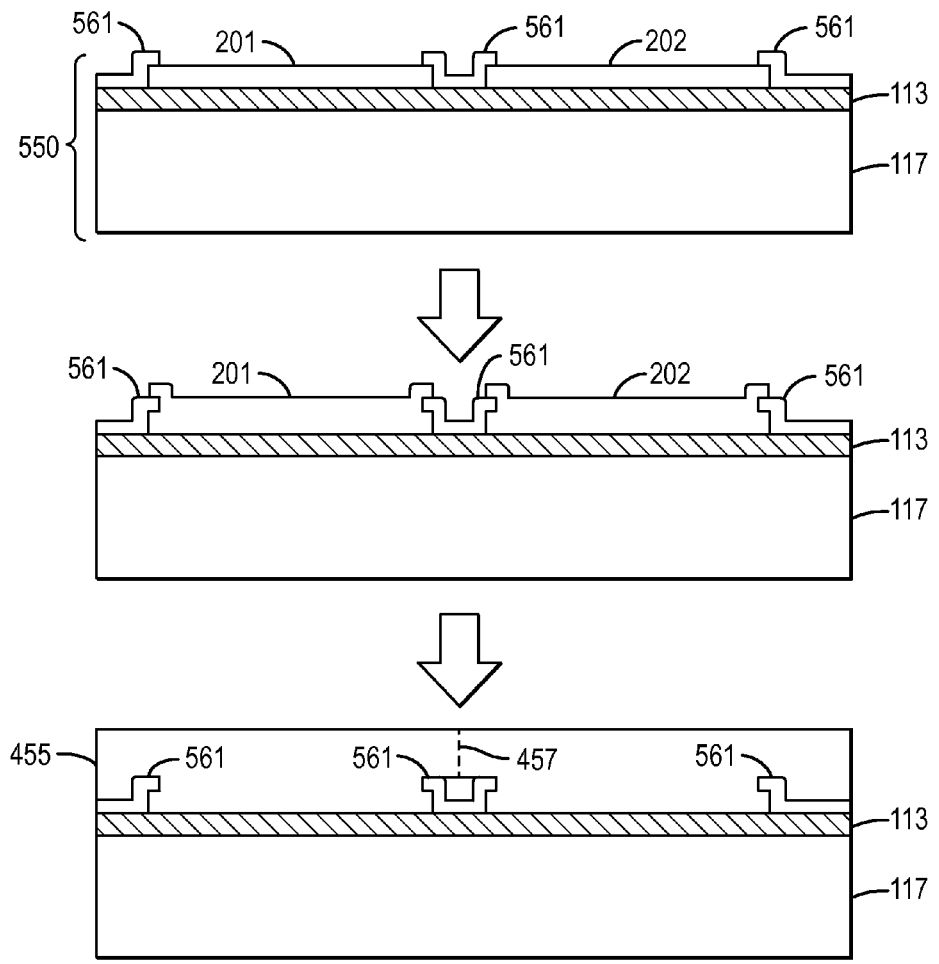

In some embodiments, the handle substrate and/or the adhesion layer may not be suitable for exposure to the epitaxial growth environment without further treatment. Exposed portions of the handle substrate may be coated with a suitable inert material. Referring to FIG. 5, first nitride crystal 201 and second nitride crystal 202 may be masked, for example, by a shadow mask or by photolithography with a photoresist, and the regions between the masked areas on the handle substrate 117 and/or adhesion layer 113 coated with inert coating 561. Inert coating 561 may comprise at least one of Ag, Au, Pt, Pd, Rh, Ru, Ir, Ni, Cr, V, Ti, Ta, $SiO_2$, $SiN_x$, or AlN. Inert coating 561 may further comprise an adhesion layer (not shown) in contact with the surface of handle substrate 117 and/or adhesion layer 113 comprising, for example, at least one of Ti, V, Cr, Al, Ni, B, Si, P, Zn, Ga, Si, Ge, Au, Ag, Zn, Cd, In, Sn, Sb, Tl, Ta, W, In, Cu, or Pb, or an oxide, nitride, or oxynitride thereof. Inert coating 561 may be deposited by sputtering, thermal evaporation, electron beam evaporation, chemical vapor deposition, plasma enhanced chemical vapor deposition, electroplating, or the like. Masked nitride/handle substrate 550 may be used as a substrate for epitaxial nitride growth by MBE, MOCVD, HVPE, ammonothermal growth, or flux growth. Flux growth may be performed, for example, using liquid Ga under a nitrogen pressure of 1 –3 GPa, using an alloy comprising Ga and at least one alkali metal under a pressure of a nitrogen-containing gas at a pressure of 10 MPa to 200 MPa, or using one or more halide, nitride, or amide salts under a pressure of a nitrogen-containing gas at a pressure of 0.1 MPa to 200 MPa. Growth is performed as known in the art, and the at least two nitride crystals 201 and 202 grow both laterally and vertically to form a merged nitride crystal 455. Because of the very low crystallographic misorientation between nitride crystals 201 and 202, the coalescence front 457 may have a modest concentration of dislocations but a classical low angle grain boundary or tilt boundary may be difficult to detect.

Figure 6:
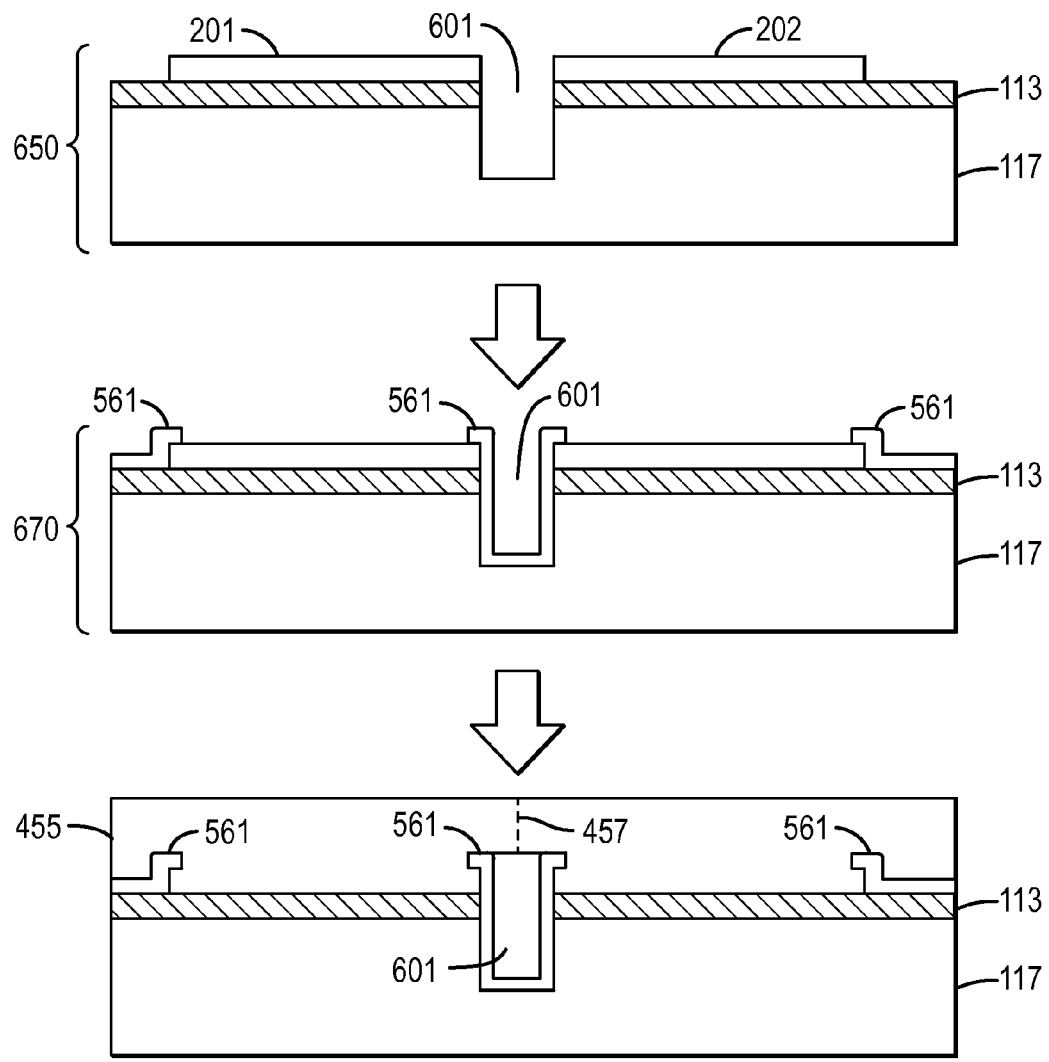
Figure 7A:
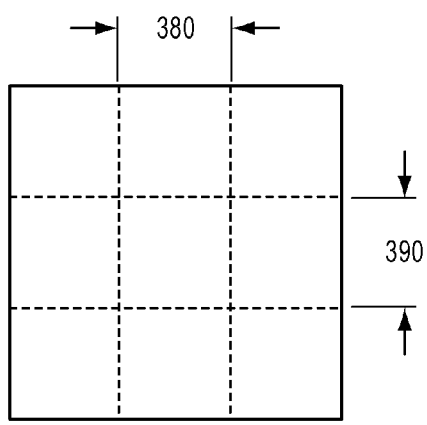
FIGS. 7A, 7B, 7C, and 7D are diagrams illustrating arrangements of merged crystals.
Figure 7B:
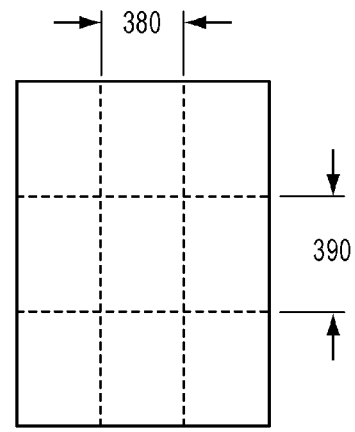
Figure 7C:
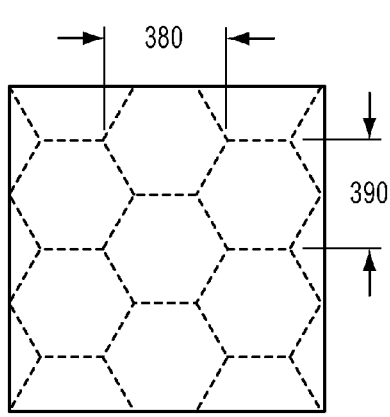
Figure 7D:
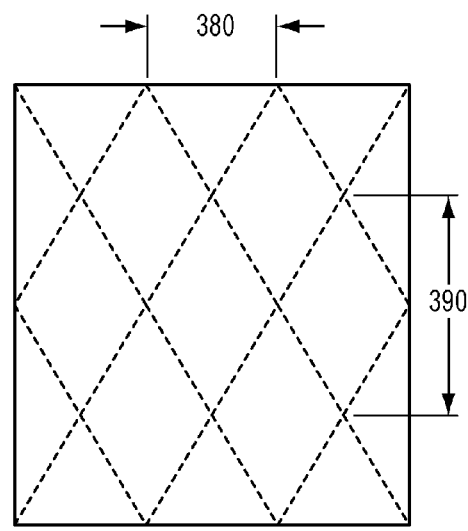

The etching/patterning and masking steps may be combined. Referring to FIG. 6, patterned nitride/handle substrate 650 having first nitride crystal 201 and second nitride crystal 202 with an etched gap 601 between them may be masked, for example, by a shadow mask or by photolithography with a photoresist, and the regions between the masked areas on handle substrate 117 and/or adhesion layer 113 coated with inert coating 561. Masked/patterned/etched nitride/handle substrate 670 may be used as a substrate for epitaxial nitride growth by MBE, MOCVD, HVPE, ammonothermal growth, or flux growth. Growth is performed as known in the art, and the at least two nitride crystals 201 and 202 grow both laterally and vertically to form a merged nitride crystal 455. Because of the very low crystallographic misorientation between nitride crystals 201 and 202, the coalescence front 457 may have a modest concentration of dislocations but a classical low angle grain boundary or tilt boundary may be difficult to detect. Threading dislocations, for example, edge dislocations, may be present at coalescence fronts 457, for example, with a line density that is less than about $1\times10^5$ $cm^{-1}$, less than about $3\times10^4$ $cm^{-1}$, less than about $1\times10^4$ $cm^{-1}$, less than about $3\times10^3$ $cm^{-1}$, less than about $1\times10^3$ $cm^{-1}$, less than about $3\times10^2$ $cm^{-1}$, or less than about $1\times10^2$ $cm^{-1}$. The density of dislocations along the coalescence fronts may be greater than 5 $cm^{-1}$, greater than 10 $cm^{-1}$, greater than 20 $cm^{-1}$, greater than 50 $cm^{-1}$, greater than 100 $cm^{-1}$, greater than 200 $cm^{-1}$, or greater than 500 $cm^{-1}$.

The merged nitride crystal may be grown to a thickness greater than 5 microns, greater than 50 microns, greater than 0.5 millimeters, or greater than 5 millimeters. After cooling and removal from the reactor, the merged nitride crystal may be separated from the handle substrate. The inert coating, if present, may be removed from at least a portion of the edge of the handle substrate by scribing, abrasion, etching, or the like. The handle substrate may be dissolved or etched away, for example, by placing in contact with an acid, a base, or a molten flux, preferably in a way that produces negligible etching or other damage to the merged nitride crystal. For example, a glass, silicon, or germanium substrate may be etched away without damaging the merged nitride crystal by treatment in a solution comprising HF and/or $H_2SiF_6$. Alternatively, a glass or zinc oxide substrate may be etched away without damaging the merged nitride crystal by treatment in a solution comprising NaOH, KOH, or $NH_4OH$. A gallium arsenide or zinc oxide substrate may be etched away without damaging the merged nitride crystal by treatment in a solution comprising aqua regia or one or more of HCl, $HNO_3$, HF, $H_2SO_4$, and $H_3PO_4$. A sapphire or alumina substrate may be etched away without damaging the merged nitride crystal by treatment in molten $KBF_4$. After removal of the handle substrate, one or more surface of the merged nitride crystal may be lapped, polished, and/or chemical-mechanically polished. The merged nitride crystal may be sliced (sawed, polished, and/or chemical-mechanically polished) into one or more wafers.

Referring to FIGS. 7A-7D, the merged nitride crystal comprises two or more domains separated by one or more lines of dislocations. Depending on the geometry of the original nitride crystals, the pattern of domains may be, for example, (a) square (FIG. 7A), (b) rectangular (FIG. 7B), (c) hexagonal (FIG. 7C), (d) rhombal (FIG. 7D), or (e) irregular (not shown). Other patterns are also possible. The domains may have a first lateral dimension 380 and a second lateral dimension 390, the lateral dimensions defining a plane that is perpendicular to the thickness, where each of the first lateral dimension 380 and the second lateral dimension 390 may be at least about 0.5 millimeter, 1 millimeter, 2 millimeters, 4 millimeters, 5 millimeters, 10 millimeters, 15 millimeters, 20 millimeters, 25 millimeters, 35 millimeters, 50 millimeters, 75 millimeters, 100 millimeters, 150 millimeters, or at least about 200 millimeters. The polar misorientation angle γ between adjacent domains may be less than 0.5 degree, less than 0.2 degree, less than 0.1 degree, less than 0.05 degree, less than 0.02 degree, or less than 0.01 degree. The misorientation angles α and β between adjacent domains may be less than 1 degree, less than 0.5 degree, less than 0.2 degree, less than 0.1 degree, less than 0.05 degree, less than 0.02 degree, or less than 0.01 degree. Typically, γ will be less than or equal to α and β. The crystallographic misorientation angles α, β, and γ may be greater than about 0.01 degree, greater than about 0.02 degree, greater than about 0.05 degree, or greater than about 0.1 degree. The density of dislocations along the lines between adjacent domains may be less than about $5\times10^5$ $cm^{-1}$, less than about $2\times10^5$ $cm^{-1}$, less than about $1\times10^5$ $cm^{-1}$, less than about $5\times10^4$ $cm^{-1}$, less than about $2\times10^4$ $cm^{-1}$, less than about $1\times10^3$ $cm^{-1}$, less than about $5\times10^3$ $cm^{-1}$, less than about $2\times10^3$ $cm^{-1}$, or less than about $1\times10^3$ $cm^{-1}$. The density of dislocations along the lines between adjacent domains may be greater than 50 $cm^{-1}$, greater than 100 $cm^{-1}$, greater than 200 $cm^{-1}$, greater than 500 $cm^{-1}$, greater than 1,000 $cm^{-1}$, greater than 2000 $cm^{-1}$, or greater than 5000 $cm^{-1}$.

Within individual domains, the merged nitride crystal may have a surface dislocation density less than about $10^7$ $cm^{-2}$, less than about $10^6$ $cm^{-2}$, less than about $10^5$ $cm^2$, less than about $10^4$ $cm^{-2}$, less than about $10^3$ $cm^{-2}$, or less than about $10^2$ $cm^2$. The domains may have a stacking-fault concentration below $10^3$ $cm^{-1}$, below $10^2$ $cm^{-1}$, below 10 $cm^{-1}$ or below 1 $cm^{-1}$. The merged nitride crystal may have a symmetric x-ray rocking curve full width at half maximum (FWHM) less than about 300 arc sec, less than about 200 arc sec, less than about 100 arc sec, less than about 50 arc sec, less than about 35 arc sec, less than about 25 arc sec, or less than about 15 arc sec. The merged nitride crystal may have a thickness between about 100 microns and about 100 millimeters, or between about 1 millimeter and about 10 millimeters. The merged nitride crystal may have a diameter of at least about 5 millimeters, at least about 10 millimeters, at least about 15 millimeters, at least about 20 millimeters, at least about 25 millimeters, at least about 35 millimeters, at least about 50 millimeters, at least about 75 millimeters, at least about 100 millimeters, at least about 150 millimeters, at least about 200 millimeters, or at least about 400 millimeters. The surface of the merged nitride crystal may have a crystallographic orientation within 10 degrees, within 5 degrees, within 2 degrees, within 1 degree, within 0.5 degree, within 0.2 degree, within 0.1 degree, within 0.05 degree, within 0.02 degree, or within 0.01 degree of (0 0 0 1) Ga-polar, (0 0 0 −1) N-polar, {1 0 −1 0} non-polar, or {1 1 −2 0} non-polar a-plane. The surface of the merged nitride crystal may have a (h k i l) semi-polar orientation, where i=−(h+k) and/and at least one of h and k are nonzero. In a specific embodiment, the crystallographic orientation of the merged nitride crystal is within 10 degrees, within 5 degrees, within 2 degrees, within 1 degree, within 0.5 degree, within 0.2 degree, within 0.1 degree, within 0.05 degree, within 0.02 degree, or within 0.01 degree of {1 1 −2 ±2}, {6 0 −6 ±1}, {5 0 −5 ±1}, {4 0 −4 ±1}, {3 0 −3 ±1}, {5 0 −5 ±2}, {7 0 −7 ±3}, {2 0 −2 ±1}, {3 0 −3 ±2}, {4 0 −4 ±3}, {5 0 −5 ±4}, {1 0 −1 ±1}, {1 0 −1 ±2}, {1 0 −1 ±3}, {2 1 −3 ±1}, or {3 0 −3 ±4}. The merged nitride crystal has a minimum lateral dimension of at least four millimeters. In some embodiments, the merged nitride crystal has a minimum lateral dimension of at least one centimeter, at least two centimeters, at least three centimeters, at least four centimeters, at least five centimeters, at least six centimeters, at least eight centimeters, at least ten centimeters, or at least twenty centimeters.

In some embodiments, the merged nitride crystal is used as a substrate for epitaxy, forming a semiconductor structure. The merged nitride crystal may be sawed, lapped, polished, dry etched, and/or chemical-mechanically polished by methods that are known in the art. One or more edges of the merged nitride crystal may be ground. The merged nitride crystal, or a wafer formed therefrom, may be placed in a suitable reactor and an epitaxial layer grown by MOCVD, MBE, HVPE, or the like. In a particular embodiment, the epitaxial layer comprises GaN or $Al_xIn_yGa_{(1-x-y)}N$, where $0 \leq x, y \leq 1$. The morphology of the epitaxial layer is uniform from one domain to another over the surface because the surface orientation is almost identical.

In some embodiments, the merged nitride crystal is used as a substrate for further tiling. For example, referring to FIGS. 1A through 1K, the nitride crystal 101 may be chosen to be a merged nitride crystal. The tiling, coalescence, and re-tiling operation may be iterated more than twice, more than 4 times, more than 8 times, or more than 16 times. In this way, by successive tiling operations, a merged nitride crystal with excellent crystalline quality and very large diameter may be fabricated.

The merged nitride crystal, or a wafer that has been sliced and polished from the merged nitride crystal or from a boule obtained by bulk crystal growth using the merged nitride crystal as a seed, may be used as a substrate for fabrication into optoelectronic and electronic devices such as at least one of a light emitting diode, a laser diode, a photodetector, an avalanche photodiode, a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, or a diode for photoelectrochemical water splitting and hydrogen generation device. In some embodiments, the positions of the devices with respect to the domain structure in the merged nitride crystal are chosen so that the active regions of individual devices lie within a single domain of the merged nitride crystal.

In other embodiments, the merged nitride crystal, or a wafer sliced and polished from the merged nitride crystal, is used as a seed crystal for bulk crystal growth. In one specific embodiment, the tiled crystal, or a wafer sliced and polished from the merged nitride crystal, is used as a seed crystal for ammonothermal crystal growth. In another embodiment, the tiled crystal, or a wafer sliced and polished from the merged nitride crystal, is used as a seed crystal for HVPE crystal growth.

In still other embodiments, the at least two nitride crystals or high quality epitaxial layers on the handle substrate, non-merged, are used as a substrate for fabrication into optoelectronic and electronic devices such as at least one of a light emitting diode, a laser diode, a photodetector, an avalanche photodiode, a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, a solar cell, and a diode for photoelectrochemical water splitting and hydrogen generation device. The at least one device may flip-chip mounted onto a carrier and the handle substrate removed.

Figure 11:
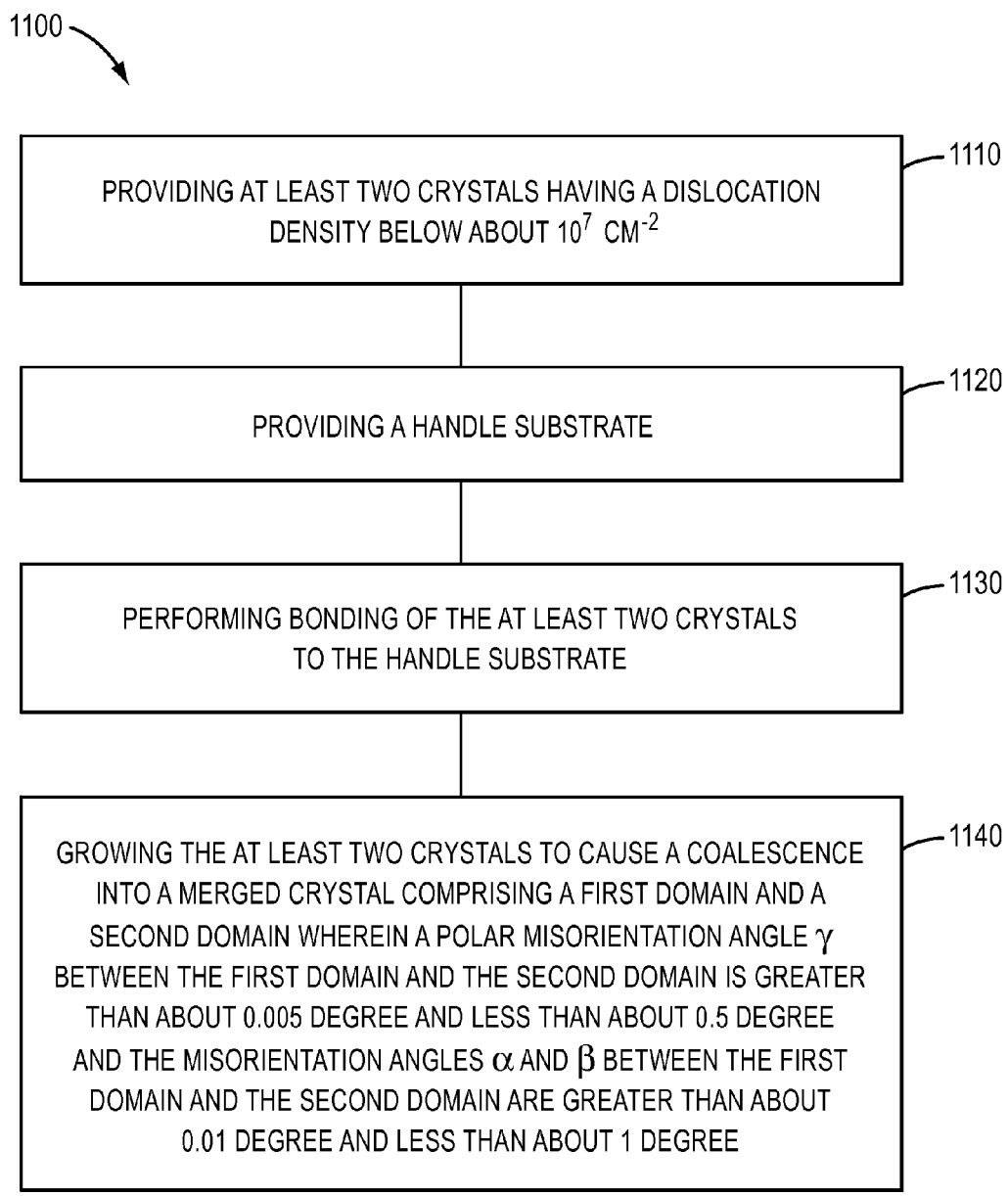
FIG. 11 is a flow chart of a method for making crystals according to some embodiments.

FIG. 11 is a flow chart depicting a method of making large area crystals. FIG. 11 shows a method 1100 for growth of a large-area crystal, the method comprising: providing at least two crystals having a dislocation density below about $10^7$ $cm^{-2}$ (see step 1110); providing a handle substrate (see step 1120); performing bonding of the at least two crystals to the handle substrate (see step 1130); and growing the at least two crystals to cause a coalescence into a merged crystal comprising a first domain and a second domain (see step 1140); wherein a polar misorientation angle γ between the first domain and the second domain is greater than about 0.005 degree and less than about 0.5 degree and the misorientation angles α and β between the first domain and the second domain are greater than about 0.01 degree and less than about 1 degree (also see step 1140).

Still further embodiments support method of making and method of use. Any of the embodiments below can be practiced in a variety of variations.

In certain embodiments of the method of FIG. 11, the at least two crystals have a hexagonal crystal structure.

In certain embodiments of the method of FIG. 11, the at least two crystals have a cubic crystal structure.

In certain embodiments of the method of FIG. 11, the at least two crystals having a cubic crystal structure are selected from BN, BP, BAs, AlP, AlAs, AlSb, β-SiC, GaP, GaAs, GaSb, InP, InAs, ZnS, ZnSe, CdS, CdSe, CdTe, CdZeTe, and HgCdTe.

In certain embodiments of the method of FIG. 11, the at least two crystals having a cubic crystal structure are selected from among ZnO, ZnS, AgI, CdS, CdSe, 2H—SiC, 4H—SiC, and 6H—SiC.

In certain embodiments of the method of FIG. 11, the at least two crystals comprise regions having a concentration of threading dislocations higher than about $10^6$ $cm^{-2}$ separated by at least one region characterized by a concentration of threading dislocations lower than about $10^6$ $cm^2$.

In certain embodiments of the method of FIG. 11, the at least two nitride crystals having a hexagonal crystal structure comprise $Al_xIn_yGa_{(1-x-y)}N$, where $0 \leq x, y, x+y \leq 1$.

In certain embodiments of the method of FIG. 11, the at least two crystals are characterized by a threading dislocation density below about $10^6$ $cm^{-2}$.

In certain embodiments of the method of FIG. 11, the at least two crystals are characterized by a threading dislocation density below about $10^4$ $cm^{-2}$.

In certain embodiments of the method of FIG. 11, at least one of the two crystals has an ion-implanted/damaged region.

In certain embodiments of the method of FIG. 11, the surfaces of the at least two crystals being bonded to the handle substrate have a crystallographic orientation within about 10 degrees of (0 0 0 1), (0 0 0 -1), {1 0 -1 0}, {2 0 -2 ±1}, {1 1 -2 ±2}, {6 0 -6 ±1}, {5 0 -5 ±1}, {40 -4 ±1}, {3 0 -3 ±1}, {5 0 -5 ±2}, {7 0 -7 ±3}, {2 0 -2 ±1}, {3 0 -3 ±2}, {4 0 -4 ±3}, {5 0 -5 ±4}, {1 0 -1 ±1}, {1 0 -1 ±2}, {1 0 -1 ±3}, {2 1 -3 ±1}, or {3 0 -3 ±4}.

In certain embodiments of the method of FIG. 11, the large-area crystal has a region with a threading dislocation density below about $10^6$ $cm^{-2}$.

In certain embodiments of the method of FIG. 11, each of the first crystal, the second crystal, the first domain, and the second domain have a minimum lateral dimension of at least two millimeters.

In certain embodiments of the method of FIG. 11, the first crystal is derived from and detached from an ion-implanted crystal and the second crystal is derived from and detached from the same crystal.

In certain embodiments of the method of FIG. 11, the first crystal is derived from a first epitaxial layer on a third crystal and the second crystal is derived from a second epitaxial layer on the third crystal.

In certain embodiments of the method of FIG. 11, the bonding of the at least two crystals to the handle substrate is performed using a wafer-bonding tool.

In certain embodiments of the method of FIG. 11, the bonding of the at least two crystals to the handle substrate is performed using a pick-and-place tool.

In certain embodiments of the method of FIG. 11, the method further comprises applying a thermal treatment to increase the melting point of an adhesion layer provided between the at least two crystals and the handle substrate.

In certain embodiments of the method of FIG. 11, the method further comprises forming a semiconductor structure on the merged crystal, or a wafer that has been sliced and polished from the merged crystal or from a boule obtained by bulk crystal growth using the merged crystal as a seed.

In certain embodiments of forming a semiconductor on the merged crystal, the semiconductor structure is incorporated into an optoelectronic or electronic device, the optoelectronic or electronic device comprising at least one of wafer sliced and polished from the merged crystal or from a boule obtained by bulk crystal growth using the merged crystal as a seed.

In certain embodiments, the positions of the devices with respect to the domain structure in the merged crystal are chosen so that the active regions of individual devices lie within a single domain of the merged crystal.

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

A template was prepared using four HVPE-grown bulk GaN crystals wafer-bonded to a handle substrate, also comprising HVPE-grown bulk GaN. The nitride crystals exhibited a crystallographic orientation within 1 degree of the (0 0 0 1) +c-plane (Ga face). The adjoining surfaces of the nitride crystals and the handle substrate were each coated with a 200 Ångstrom Ti layer followed by a 1.5 micron Au layer and wafer-bonded at a pressure of 5.4 MPa and a temperature of 450° C. under vacuum. The gaps between adjacent bonded nitride crystals were approximately 85 microns. The misorientation angles α, β, and γ between the adjacent bonded nitride crystals were all less than 0.1 degrees. The template was degreased, suspended by a silver wire, and placed in a silver capsule with a baffle. Approximately 37.3 g of polycrystalline GaN, 1.27 g of $NH_4F$ mineralizer, and 30.4 g of ammonia were also placed in the capsule and the capsule was hermetically sealed. The capsule was placed in an internally-heated high pressure apparatus, heated to a temperature of approximately 675° C. for approximately 68 hours, then cooled, removed, and opened. The gap between the two nitride crystals was closed by newly-grown GaN, causing full coalescence of the crystals. The coalesced nitride crystal was removed from the handle substrate by dissolution of the Ti—Au adhesion layers by soaking in concentrated aqua regia solution. The linear etch pit densities at the coalescence fronts were measured as approximately $1.2 \times 10^3$ cm$^{-1}$, indicating high-quality boundaries.

Example 2

A template was prepared using two HVPE-grown bulk GaN crystals bonded to a handle substrate, also comprising HVPE-grown bulk GaN. The nitride crystals exhibited a crystallographic orientation within 1 degree of the (0 0 0 1) +c-plane (Ga face). The adjoining surfaces of the handle substrate and the nitride crystals were coated with a 200 Ångstrom Ti layer followed by a 1.0 micron Au layer. The nitride crystals further had an array of 300 micron diameter Si dots having a height of 0.6 microns, the dots being located at the vertices of a square grid having a period of 1,000 microns in both the x- and y-directions. The handle substrate was then placed on a heated stage at 475° C. and a pick and place tool was used to precisely position the two nitride crystals on the handle substrate. The adjoining surfaces of the nitride crystals and the handle substrate, while precisely aligned, were placed in contact for approximately 30 seconds and a bond was formed. The misorientation angles α and β between the adjacent bonded nitride crystals were less than 0.3 degrees and the misorientation angle γ between the adjacent bonded nitride crystals was less than 0.1 degree. The bonded template was subsequently heated to 275° C. in a nitrogen atmosphere and held for 24 hours. The template was degreased, suspended by a silver wire, and placed in a silver capsule with a baffle. Approximately 43.5 g of polycrystalline GaN, 1.28 g of $NH_4F$ mineralizer, and 30.6 g of ammonia were also placed in the capsule and the capsule was hermetically sealed. The capsule was placed in an internally-heated high pressure apparatus, heated to a temperature of approximately 680° C. for approximately 20 hours, then cooled, removed, and opened. The gap between the two nitride crystals was closed by newly-grown GaN, causing full coalescence of the crystals. No pits were identified at the coalescence front by scanning electron microscopy (SEM), indicating a high-quality boundary.

Example 3

A template was prepared using three HVPE-grown bulk GaN crystals bonded to a handle substrate, also comprising HVPE-grown bulk GaN. The nitride crystals exhibited a crystallographic orientation that was miscut from the {1 0 -1 0} m-plane by approximately 0.25 degree toward [0 0 0 -1]. The adjoining surfaces of the handle substrate and the nitride crystals were coated with a 200 Ångstrom Ti layer followed by approximately a 20 micron thick Au layer and 3 micron thick AuSn layer on the handle substrate and the nitride crystals, respectively. The handle substrate was then placed on a heated stage at 330° C. and a pick and place tool was used to precisely position the three nitride crystals on the handle substrate. The adjoining surfaces of the nitride crystals and the handle substrate, while precisely aligned, were placed in contact for approximately 30 seconds and a bond was formed. The template was degreased and placed in a silver capsule with a baffle. Approximately 4,815 g of polycrystalline GaN, 172 g of NH$_4$F mineralizer, and 3,608 g of ammonia were also placed in the capsule and the capsule was hermetically sealed. The capsule was placed in an internally-heated high pressure apparatus, heated to a temperature of approximately 680° C. for approximately 100 hours, then cooled, removed, and opened. The gap between the three nitride crystals was closed by newly-grown GaN, causing full coalescence of the crystals. The three nitride crystals were subsequently removed from the handle substrate as one distinct piece. The misorientation angles α and β between the adjacent bonded nitride crystals were between about 0.02 degree and about 0.45 degrees and the misorientation angles γ between the adjacent bonded nitride crystals were about 0.09 degree and about 0.11 degree, respectively. The linear etch pit densities at the coalescence fronts were measured as approximately 6.08× 10$^3$ cm$^{-1}$ and 5.84×10$^3$ cm$^{-1}$ for the two coalescence boundaries, indicating high-quality boundaries.

Example 4

A template was prepared using three HVPE-grown bulk GaN crystals bonded to a handle substrate comprising polycrystalline AlN. The nitride crystals exhibited a crystallographic orientation within about 0.5 degree of {1 0 –1 –1}. The adjoining surfaces of the handle substrate and the nitride crystals were coated with a 200 Ångstrom Ti layer followed by approximately a 20 micron thick Au layer and 3 micron thick AuSn layer on the handle substrate and the nitride crystals, respectively. The handle substrate was then placed on a heated stage at 330° C. and a pick and place tool was used to precisely position the three nitride crystals on the handle substrate. The adjoining surfaces of the nitride crystals and the handle substrate, while precisely aligned, were placed in contact for approximately 30 seconds and a bond was formed. The template was degreased and placed in a silver capsule with a baffle. Approximately 43.5 g of polycrystalline GaN, 2.56 g of NH$_4$F mineralizer, and 30 g of ammonia were also placed in the capsule and the capsule was hermetically sealed. The capsule was placed in an internally-heated high pressure apparatus, heated to a temperature of approximately 655° C. for approximately 51 hours, then cooled, removed, and opened. The gap between the three nitride crystals was closed by newly-grown GaN, causing full coalescence of the crystals. The misorientation angles α and β between the adjacent pairs of bonded nitride crystals were between about 0.03 degree and about 0.26 degree and the misorientation angles γ between the adjacent bonded nitride crystals were about 0.085 degree and less than 0.01 degree, respectively.

Example 5

A template was prepared using two HVPE-grown bulk GaN crystals bonded to a handle substrate comprising AlN. The nitride crystals exhibited a crystallographic orientation that was miscut from the {1 0 –1 0} m-plane by approximately 0.25 degree toward [0 0 0 –1]. The adjoining surfaces of the handle substrate and the nitride crystals were coated with a 3,000 Ångstrom Ti layer followed by approximately a 20 micron thick Au layer and 3 micron thick AuSn layer on the handle substrate and the nitride crystals, respectively. The handle substrate was then placed on a heated stage at 330° C. and a pick and place tool was used to precisely position the two nitride crystals on the handle substrate. The adjoining surfaces of the nitride crystals and the handle substrate, while precisely aligned, were placed in contact for approximately 30 seconds and a bond was formed. The template was degreased and placed in a silver capsule with a baffle. Approximately 37.54 g of polycrystalline GaN, 2.57 g of NH$_4$F mineralizer, and 30.08 g of ammonia were also placed in the capsule and the capsule was hermetically sealed. The capsule was placed in an internally-heated high pressure apparatus, heated to a temperature of approximately 663° C. for approximately 51 hours, then cooled, removed, and opened. The gap between the two nitride crystals was closed by newly-grown GaN, causing full coalescence of the crystals. The two nitride crystals were subsequently removed from the handle substrate as one distinct piece. The nitride crystals were then placed in a silver capsule with a baffle. Approximately 3,560 g of polycrystalline GaN, 174.1 g of NH$_4$F mineralizer, and 2,637.88 g of ammonia were also placed in the capsule and the capsule was hermetically sealed. The capsule was placed in an internally-heated high pressure apparatus, heated to a temperature of approximately 680° C. for approximately 116 hours, then cooled, removed, and opened. The misorientation angles α and β between the adjacent bonded nitride crystals were approximately 0.03 degree and the misorientation angle γ between the adjacent bonded nitride crystals was approximately 0.04 degree. The linear etch pit densities at the coalescence front was measured as approximately 6.75×10$^3$ cm$^{-1}$, indicating high-quality boundaries.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A gallium-containing nitride merged crystal made from a process comprising:
    depositing an adhesion layer on a surface of a handle substrate, said adhesion layer having a melting point at a first temperature;
    while said adhesion layer is at a temperature of no less than said first temperature to melt said adhesion layer to enhance its adhesion, bonding at least a first crystal and a second crystal to said adhesion layer to form a tiled substrate, said first crystal having a first nominal crystallographic orientation ($x_1$ $y_1$ $z_1$), and said second crystal having a second nominal crystallographic orientation ($x_2$ $y_2$ $z_2$), said first nominal crystallographic orientation ($x_1$ $y_1$ $z_1$) and said second nominal crystallographic orientation ($x_2$ $y_2$ $z_2$) being identical; and
    after said first and second crystals are adhered to said adhesion layer, heat treating said adhesion layer to form a heat-treated adhesion layer, said heat-treated adhesion layer having a melting point at a second temperature higher than said first temperature;
    laterally and vertically growing a crystalline composition over said tiled substrate using ammonothermal growth at a third temperature to form a merged crystal, said third temperature being higher than said first temperature and below said second temperature, wherein said first and second crystals define first and second domains in said merged crystal.

2. The crystal of claim 1, wherein each of the first domain and the second domain comprises GaN.

3. The crystal of claim 1, wherein each of the first domain and the second domain is characterized by a dislocation density of less than 10$^6$ cm$^{-2}$.

4. The crystal of claim 1, wherein each of the first domain and the second domain is characterized by a dislocation density of less than $10^5$ cm$^{-2}$.

5. The crystal of claim 1, wherein each of the first domain and the second domain is characterized by a dislocation density of less than $10^4$ cm$^{-2}$.

6. The crystal of claim 1, wherein the first domain and the second domain are separated by a line of dislocations with a linear density less than $2\times10^5$ cm$^{-1}$ and the polar misorientation angle $\gamma$ between the first domain and the second domain is less than 0.3 degree and the misorientation angles $\alpha$ and $\beta$ are less than 0.6 degree.

7. The crystal of claim 1, wherein the first domain and the second domain are separated by a line of dislocations with a linear density less than $1\times10^5$ cm$^{-1}$ and the polar misorientation angle $\gamma$ between the first domain and the second domain is less than 0.1 degree and the misorientation angles $\alpha$ and $\beta$ are less than 0.2 degrees.

8. The crystal of claim 7, wherein the first domain and the second domain are separated by a line of dislocations with a linear density less than $1\times10^4$ cm$^{-1}$ and the polar misorientation angle $\gamma$ between the first domain and the second domain is less than 0.05 degrees.

9. The crystal of claim 1, wherein each of the first domain and the second domain are characterized by a nonpolar or semipolar surface crystallographic orientation and one or both of the first domain and the second domain are characterized by a stacking-fault concentration of about $10^3$ cm$^{-1}$ or less.

10. The crystal of claim 1, wherein each of the first domain and the second domain is characterized by an impurity concentration of H greater than about $10^{17}$ cm$^{-2}$ and an impurity concentration of at least one of Li, Na, K, Rb, Cs, F, and Cl greater than about $10^{15}$ cm$^{-1}$.

11. The crystal of claim 1, further comprising a semiconductor structure overlying at least one of the first domain and the second domain.

12. The crystal of claim 11, wherein an active layer of the semiconductor structure lies within a single domain.

13. The crystal of claim 12, wherein the semiconductor structure forms a portion of a device selected from a light emitting diode, a laser diode, a photodetector, an avalanche photodiode, a transistor, a rectifier, a thyristor, Schottky rectifier, a p-i-n diode, a metal-semiconductor-metal diode, a high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and a combination of any of the foregoing.

14. The crystal of claim 1, wherein,
each of the first domain and the second domain is characterized by a crystallographic orientation within 5 degrees of a (0 0 0 1) Ga-polar plane; and
$z_1$ and $z_2$ are unit vectors along [0 0 0 -1], $x_1$ and $x_2$ are unit vectors along [1 0 -1 0], and $y_1$ and $y_2$ are unit vectors along [1 -2 1 0].

15. The crystal of claim 1 wherein,
each of the first domain and the second domain is characterized by a crystallographic orientation within 5 degrees of a {1 0 -1 0} non-polar plane; and
$z_1$ and $z_2$ are unit vectors along [-1 0 1 0], $x_1$ and $x_2$ are unit vectors along [1 -2 1 0], and $y_1$ and $y_2$ are unit vectors along [0 0 0 1].

16. The crystal of claim 1, wherein each of the first domain and the second domain is characterized by a crystallographic orientation within 5 degrees of an orientation selected from a{1 1 -2 ±2} plane, a {6 0 -6 ±1} plane, a {5 0 -5 ±1} plane, a {4 0 -4±1} plane, a {3 0 -3 ±1} plane, a {5 0 -5 ±2} plane, a {7 0 -7 ±3} plane, a {2 0 -2 ±1} plane, a {3 0 -3 ±2} plane, a {4 0 -4 ±3}, a {5 0 -5 ±4} plane, a {1 0-1 ±1} plane, a {1 0 -1 ±2} plane, a {1 0 -1 ±3} plane, a {2 1 -3 ±1} plane, and a {3 0 -3 ±4} plane.

17. The crystal of claim 1, wherein said first domain is characterized by a first lateral dimension and a second lateral dimension, and the second domain is characterized by a third lateral dimension and a fourth lateral dimension, wherein each of the first lateral dimension, the second lateral dimension, the third lateral dimension, and the fourth lateral dimension are greater than 10 millimeters.

18. The crystal of claim 1, wherein each of the first domain and the second domain is characterized by an impurity concentration of O, H, C, and at least one of Na and K between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $3\times10^{15}$ cm$^{-3}$ and $1\times10^{18}$ cm$^{-3}$, respectively, as quantified by calibrated secondary ion mass spectrometry (SIMS).

19. The crystal of claim 1, wherein each of the first domain and the second domain is characterized by an impurity concentration of O, H, C, and at least one of F and Cl between about $1\times10^{16}$ cm$^{-3}$ and $1\times10^{19}$ cm$^{-3}$, between about $1\times10^{16}$ cm$^{-3}$ and $2\times10^{19}$ cm$^{-3}$, below $1\times10^{17}$ cm$^{-3}$, and between about $1\times10^{15}$ cm$^{-3}$ and $1\times10^{17}$ cm$^{-3}$, respectively, as quantified by calibrated secondary ion mass spectrometry (SIMS).

20. The crystal of claim 1, wherein said growing comprises epitaxial growth.

21. The crystal of claim 1, wherein
$z_1$ is a negative surface normal of the first nominal crystallographic orientation, and $x_1$ and $y_1$ are crystallographic vectors that are orthogonal to $z_1$;
$z_2$ is a negative surface normal of the second nominal crystallographic orientation, and $x_2$ and $y_2$ are crystallographic vectors that are orthogonal to $z_2$;
a polar misorientation angle $\gamma$ between $z_1$ and $z_2$ is greater than about 0.005 degrees and less than about 0.5 degrees;
a misorientation angle $\alpha$ between $x_1$ and $x_2$ is greater than about 0.01 degrees and less than about 1 degree; and
a misorientation angle $\beta$ between $y_1$ and $y_2$ is greater than about 0.01 degrees and less than about 1 degree.

22. The crystal of claim 1, wherein said first temperature is no greater than about 500° C., said second temperature is no less than about 700° C., and said third temperature is no less than 600° C.

* * * * *